(12) United States Patent
Dou et al.

(10) Patent No.: US 11,800,784 B2
(45) Date of Patent: Oct. 24, 2023

(54) TWO-DIMENSIONAL HALIDE PEROVSKITE MATERIALS

(71) Applicant: Purdue Research Foundation, West Lafayette, IN (US)

(72) Inventors: Letian Dou, West Lafayette, IN (US); Yao Gao, West Lafayette, IN (US); Enzheng Shi, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 372 days.

(21) Appl. No.: 17/012,137

(22) Filed: Sep. 4, 2020

(65) Prior Publication Data

US 2021/0343948 A1    Nov. 4, 2021

Related U.S. Application Data

(60) Provisional application No. 62/899,298, filed on Sep. 12, 2019.

(51) Int. Cl.
| | | |
|---|---|---|
| *H10K 85/30* | (2023.01) | |
| *C09K 11/06* | (2006.01) | |
| *C07F 7/24* | (2006.01) | |
| *H01G 9/20* | (2006.01) | |
| *H10N 10/856* | (2023.01) | |
| *H10N 10/857* | (2023.01) | |
| *H01S 5/36* | (2006.01) | |

(52) U.S. Cl.
CPC ............... *H10K 85/30* (2023.02); *C07F 7/24* (2013.01); *C09K 11/06* (2013.01); *H01G 9/20* (2013.01); *H10N 10/856* (2023.02); *H10N 10/857* (2023.02); *C09K 2211/188* (2013.01); *H01S 5/36* (2013.01)

(58) Field of Classification Search
None
See application file for complete search history.

(56) References Cited

U.S. PATENT DOCUMENTS 10,128,052 B1    11/2018 Zang et al.

*Primary Examiner* — Joseph R Kosack
(74) *Attorney, Agent, or Firm* — Purdue Research Foundation

(57) ABSTRACT

The present disclosure relates to novel two-dimensional halide perovskite materials, and the method of making and using the two-dimensional halide perovskite materials.

14 Claims, 6 Drawing Sheets

TWO-DIMENSIONAL HALIDE PEROVSKITE MATERIALS

CROSS-REFERENCE TO RELATED APPLICATION

The present Application claims the priority benefit of U.S. Provisional Application No. 62/899,298, which was filed Sep. 12, 2019, and the content of which is hereby incorporated by reference in its entirety.

GOVERNMENT RIGHTS

This invention was made with government nm support under Award No. N00014-19-1-2296 awarded by the Office of Naval Research. The government has certain rights in the invention.

TECHNICAL FIELD

The present disclosure relates to novel two-dimensional halide perovskite materials, and the method of making and using the two-dimensional halide perovskite materials.

BACKGROUND

This section introduces aspects that may help facilitate a better understanding of the disclosure. Accordingly, these statements are to be read in this light and are not to be understood as admissions about what is or is not prior art.

Lateral heterostructures of two-dimensional (2D) semiconductors provide a new material platform for semiconductor integration. However, realizing atomically sharp lateral interfaces in conventional 2D materials has been proven extremely challenging. As an emerging class of organic-inorganic hybrid semiconductors, 2D Ruddlesden-Popper (RP) phase halide perovskites $L_2A_{n-1}M_nX_{3n+1}$ (L and A are cations; M is a metal cation; X is a halide anion; n indicates the number of metal halide octahedral layers sandwiched by two adjacent L layers) exhibit high photoluminescence quantum yield, long carrier lifetime and diffusion length, as well as remarkable tunability in optoelectronic properties due to their structural and compositional complexity. Moreover, 2D halide perovskite materials are quantum wells composed of repeated organic and inorganic layers periodically along the out-of-plane direction, providing further structure and property tunability. Thus, adopting 2D halide perovskites as building blocks in 2D lateral heterostructures will open up many unprecedented opportunities. Heterostructures based on different three-dimensional halide perovskites ($CsPbBr_3$ and $CsPbCl_3$) have been fabricated via ion exchange method, which generally leads to high structural defect density, thus accelerating material degradation. Critically, the large intrinsic ion diffusivity results in fast interdiffusion of different halides across the interface. As a result, only very diffusive junction (~500 nm junction width) with low stability was obtained. Additionally, attempts were also made to develop lateral heterostructures between bulk RP halide perovskites with different n numbers via cation intercalation. Unlike 2D lateral transition metal dichalcogenides heterostructures synthesized by high temperature vapor phase epitaxial growth, it seems impossible to obtain sharp interfaces in perovskite heterostructures synthesized by ion exchange or intercalation methods because of the low spatial resolution of lithography mask and the ion penetration and diffusion at solid/liquid interface. Therefore, ideal 2D halide perovskite lateral heterostructures have long been pursued but have not yet been achieved.

Highly stable and widely tunable lateral heterostructures of 2D halide perovskite materials and methods to make such materials are therefore still needed.

SUMMARY

The present disclosure relates to novel two-dimensional halide perovskite materials, and the method of making and using the two-dimensional halide perovskite materials.

In one embodiment, the present disclosure provides two-dimensional halide perovskite material, comprising: a first halide perovskite component of formula $L_2A_{n-1}M_nX_{3n+1}$ and a second halide perovskite component of formula $L'_2A'_{n'-1}M'_{n'}X'_{3n'+1}$, wherein:

L represents a conjugated organic ligand cation of a conjugated and optionally substituted aryl and/or hetero aryl system, wherein each aryl and/or hetero aryl ring in the conjugated and optionally substituted aryl or hetero aryl system may be same or different;

L' represents a conjugated or a non-conjugated organic ligand cation;

A and A' each independently represents a cation $Cs^+$, $Rb^+$, $CH_3NH_3^+$, $CH_3CH_2NH_3^+$, or

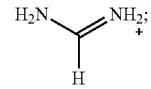

M and M' each independently represents a divalent metal cation $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$; $Pd^{2+}$; $Pt^{2+}$;

X and X' each independently represents $F^-$, $Cl^-$, $Br^-$ or $I^-$;

n and n' each independently is 1-6; and wherein the first halide perovskite component and the second halide perovskite component are not the same perovskite, and the first halide perovskite is first formed as a lateral core and the second halide perovskite is formed surrounding the lateral core of the first halide perovskite.

DETAILED DESCRIPTION

Figure 1:
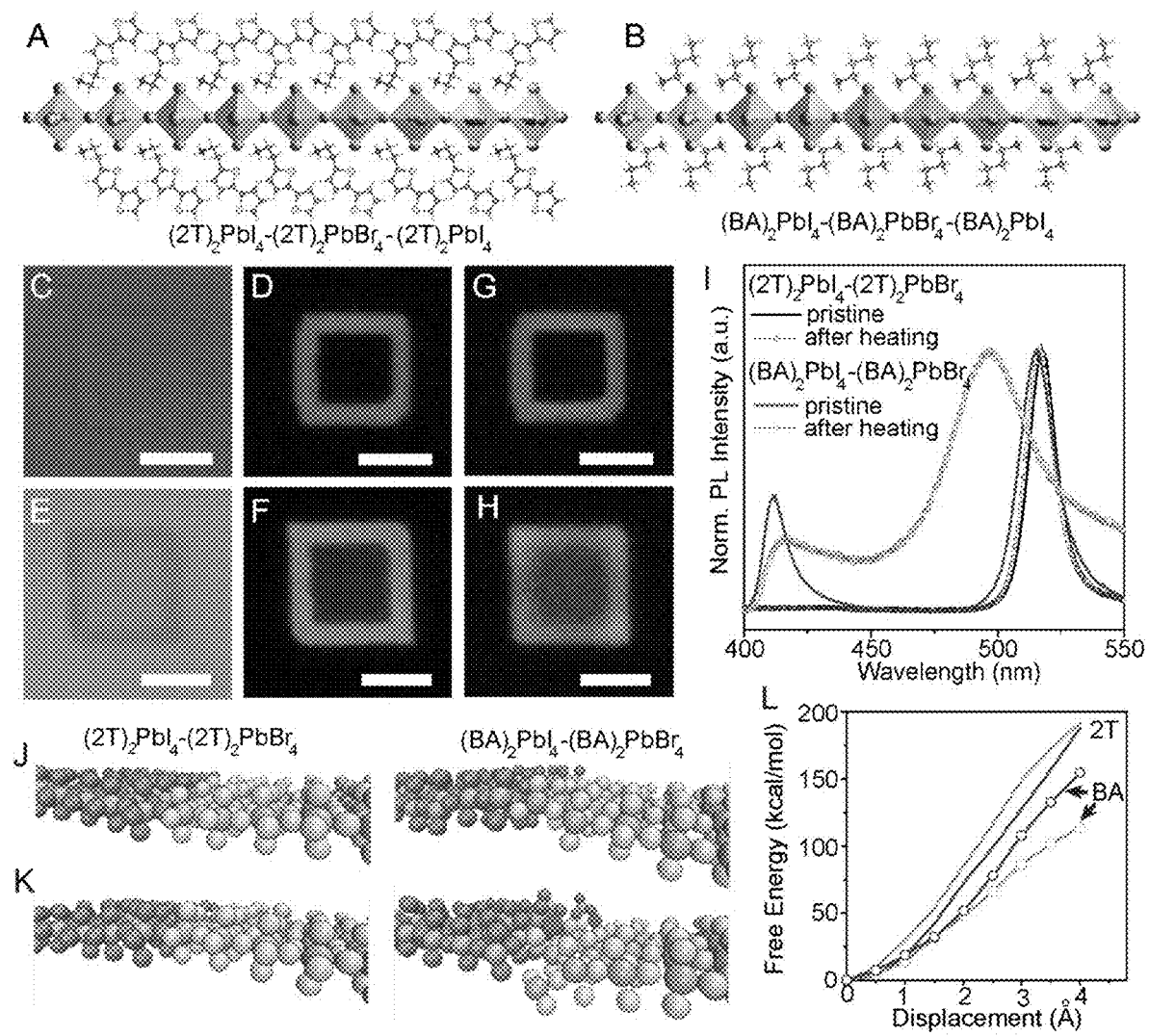
FIG. 1: Two-dimensional halide perovskite lateral heterostructures stabilized by conjugated ligands. (A) Schematic illustration of $(2T)_2PbI_4$-$(2T)_2PbBr_4$ lateral heterostructure; (B) Schematic illustration of $(BA)_2PbI_4$-$(BA)_2PbBr_4$ lateral heterostructure; (C, D) Optical and PL images of a $(2T)_2PbI_4$-$(2T)_2PbBr_4$ lateral heterostructure. (E, F) Optical and PL images of a $(BA)_2PbI_4$-$(BA)_2PbBr_4$ lateral heterostructure. (G) PL image of the $(2T)_2PbI_4$-$(2T)_2PbBr_4$ lateral heterostructure after 1 h of heating at 100° C. (H) PL image of the $(BA)_2PbI_4$-$(BA)_2PbBr_4$ lateral heterostructure after 1 h of heating at 100° C. (I) Corresponding PL spectra of both the $(BA)_2PbI_4$-$(BA)_2PbBr_4$ and $(2T)_2PbI_4$-$(2T)_2PbBr_4$ lateral heterostructures before and 1 h of heating at 100° C. All scale bars are 3 μm. Snapshots from the molecular dynamics simulations at 298 K (J) and 800 K (K) for $(BA)_2PbI_4$-$(BA)_2PbBr_4$ (left) and $(2T)_2PbI_4$-$(2T)_2PbBr_4$ showing the interface between each perovskite domain. For clarity, the organic ligands have been hidden and only the inorganic framework is shown. The colors correspond to: purple for iodine atoms, orange for bromide atoms, and gray for lead atoms. The iodine atoms that have diffused across the interface in $(BA)_2PbI_4$-$(BA)_2PbBr_4$ (top right) and into the bromide domain are indicated by colored red. (L) Free energy of removing a halide atom from an apical position to vacuum to generate a halide vacancy. Orange plots correspond to 2D bromide perovskite and purple plots correspond to iodide perovskites.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 10%, within 5%, or within 1% of a stated value or of a stated limit of a range.

In the present disclosure the term "substantially" can allow for a degree of variability in a value or range, for example, within 90%, within 95%, or within 99% of a stated value or of a stated limit of a range.

The term "substituted" as used herein refers to a functional group in which one or more hydrogen atoms contained therein are replaced by one or more non-hydrogen atoms. The term "functional group" or "substituent" as used herein refers to a group that can be or is substituted onto a molecule. Examples of substituents or functional groups include, but are not limited to, a halogen (e.g., F, Cl, Br, and I); an oxygen atom in groups such as hydroxyl groups, alkoxy groups, aryloxy groups, aralkyloxy groups, oxo (carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, azides, hydroxylamines, cyano, nitro groups, N-oxides, hydrazides, and enamines; and other heteroatoms in various other groups.

Non-limiting examples of substituents, that can be bonded to a substituted carbon (or other such as nitrogen) atom include F, Cl, Br, I, OR, OC(O)N(R)$_2$, CN, NO, NO$_2$, ONO$_2$, azido, CF$_3$, OCF$_3$, R, O (oxo), S (thiono), C(Oa), S(O), methylenedioxy, ethylenedioxy, N(R)$_2$, SR, SOR, SO$_2$R, SO$_2$N(R)$_2$, SO$_3$R, (CH$_2$)$_{0-2}$P(O)OR$_2$, C(O)R, C(O)C(O)R, C(O)CH₂C(O)R, C(S)R, C(O)OR, OC(O)R, C(O)N(R)₂, OC(O)N(R)₂, C(S)N(R)₂, (CH₂)₀₋₂N(R)C(O)R, (CH₂)₀₋₂N(R)C(O)OR, (CH₂)₀₋₂N(R)N(R)₂, N(R)N(R)C(O)R, N(R)N(R)C(O)OR, N(R)N(R)CON(R)₂, N(R)SO₂R, N(R)SO₂N(R)₂, N(R)C(O)OR, N(R)C(O)R, N(R)C(S)R, N(R)C(O)N(R)₂, N(R)C(S)N(R)₂, N(COR)COR, N(OR)R, C(=NH)N(R)₂, C(O)N(OR)R, or C(=NOR)R wherein R can be hydrogen or a carbon-based moiety, and wherein the carbon-based moiety can itself be further substituted; for example, wherein R can be hydrogen, alkyl, acyl, cycloalkyl, aryl, aralkyl, heterocyclyl, heteroaryl, or heteroarylalkyl, wherein any alkyl, acyl, cycloalkyl, aryl, aralkyl, heterocyclyl, heteroaryl, or heteroarylalkyl or R can be independently mono- or multi-substituted; or wherein two R groups bonded to a nitrogen atom or to adjacent nitrogen atoms can together with the nitrogen atom or atoms form a heterocyclyl, which can be mono- or independently multi-substituted.

The term "organic ligand cation" as used herein may refer to any organic cation with a protonated basic nitrogen atom. A suitable organic ligand cation may have a generic formula R-(A$_N$)⁺, wherein R may be but is not limited to unsubstituted or substituted C1-C20 alkyl/cycloalkyl, or substituted or unsubstituted aryl and/or heteroaryl, wherein (A$_N$)⁺ may be a suitable nitrogen containing cation such as but is not limited to NH₃⁺, [C(NH₂)₂]⁺, or

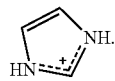

In one aspect, R is unsubstituted or substituted C1-C10 alkyl/cycloalkyl, substituted or unsubstituted phenyl, thienyl, or any combination thereof.

Non-limiting examples of some suitable organic ligand cations may be:

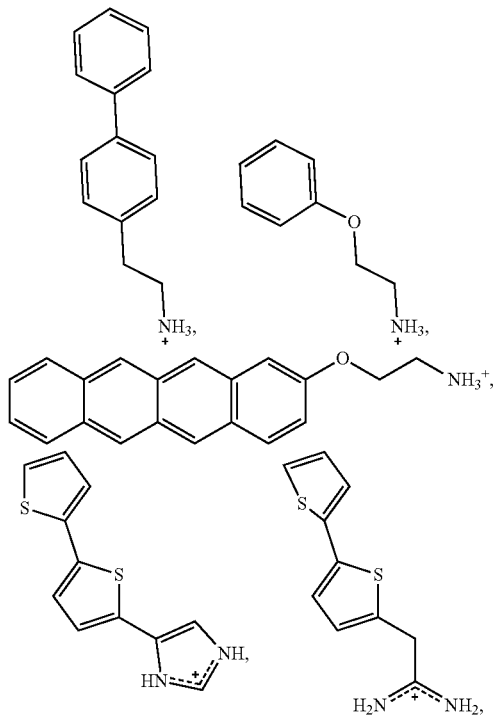

-continued

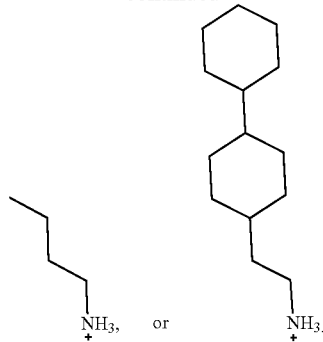

The term "aryl" as used herein refers to substituted or unsubstituted cyclic aromatic hydrocarbons that do not contain heteroatoms in the ring. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain about 6 to about 14 carbons ($C_6$-$C_{14}$) or from 6 to 10 carbon atoms ($C_6$-$C_{10}$) in the ring portions of the groups. Aryl groups can be unsubstituted or substituted, as defined herein. Representative substituted aryl groups can be mono-substituted or substituted more than once, such as, but not limited to, 2-, 3-, 4-, 5-, or 6-substituted phenyl or 2-8 substituted naphthyl groups, which can be substituted with carbon or non-carbon groups such as those listed herein.

A "hetero aryl" represents aromatic ring comprising at least one hetero atom such as N, S, O, or Se. Hetero aryl in the present disclosure may be any hetero aryl. Hetero aryl in the present disclosure may be but is not limited to pyrrolidinyl, azetidinyl, piperidynyl, piperazinyl, morpholinyl, chromanyl, indolinonyl, isoindolinonyl, furanyl, pyrrolidinyl, pyridinyl, pyrazinyl, pyrimidinyl, triazinyl, thiophenyl, tetrahydrofuranyl, pyrrolyl, oxazolyl, oxadiazolyl, imidazolyl, triazyolyl, tetrazolyl, benzoxazolinyl, benzthiazolinyl, benzimidazolinyl groups, or any combination thereof.

The terms "halo," "halogen," or "halide" group, as used herein, by themselves or as part of another substituent, mean, unless otherwise stated, a fluorine, chlorine, bromine, or iodine atom. The compounds described herein may contain one or more chiral centers, or may otherwise be capable of existing as multiple stereoisomers. It is to be understood that in one embodiment, the invention described herein is not limited to any particular stereochemical requirement, and that the compounds, and compositions, methods, uses, and medicaments that include them may be optically pure, or may be any of a variety of stereoisomeric mixtures, including racemic and other mixtures of enantiomers, other mixtures of diastereomers, and the like. It is also to be understood that such mixtures of stereoisomers may include a single stereochemical configuration at one or more chiral centers, while including mixtures of stereochemical configuration at one or more other chiral centers.

Similarly, the compounds described herein may include geometric centers, such as cis, trans, E, and Z double bonds. It is to be understood that in another embodiment, the invention described herein is not limited to any particular geometric isomer requirement, and that the compounds, and compositions, methods, uses, and medicaments that include them may be pure, or may be any of a variety of geometric isomer mixtures. It is also to be understood that such mixtures of geometric isomers may include a single configuration at one or more double bonds, while including mixtures of geometry at one or more other double bonds.

The term "optionally substituted," or "optional substituents," as used herein, means that the groups in question are either unsubstituted or substituted with one or more of the substituents specified. When the groups in question are substituted with more than one substituent, the substituents may be the same or different. When using the terms "independently," "independently are," and "independently selected from" mean that the groups in question may be the same or different. Certain of the herein defined terms may occur more than once in the structure, and upon such occurrence each term shall be defined independently of the other.

The present disclosure provides highly stable and widely tunable lateral heterostructures of 2D halide perovskites via a solution-phase epitaxial growth method. Intriguingly and unexpectedly, the present disclosure provides that the interdiffusion of halide anions can be effectively inhibited by incorporating rigid π-conjugated ligands. Sharp interface and epitaxial growth are validated from low dose aberration-corrected high-resolution transmission electron microscopy (AC-HRTEM) characterizations. Molecular dynamic simulation reveals that the suppressed halide anion diffusivity is attributed to either the lower degree of interfacial structural disorder in $(2T)_2PbI_4$-$(2T)_2PbBr_4$ heterojunctions or a lower halide vacancy concentration because of the larger energy barrier of removing the halide anions from the perovskite structure for 2D perovskites with conjugated ligands. Furthermore, a wide range of 2D lateral halide perovskite heterostructures, multi-heterostructures and superlattices have been successfully synthesized, indicating the versatility of the new fabrication approach.

Figure 4:
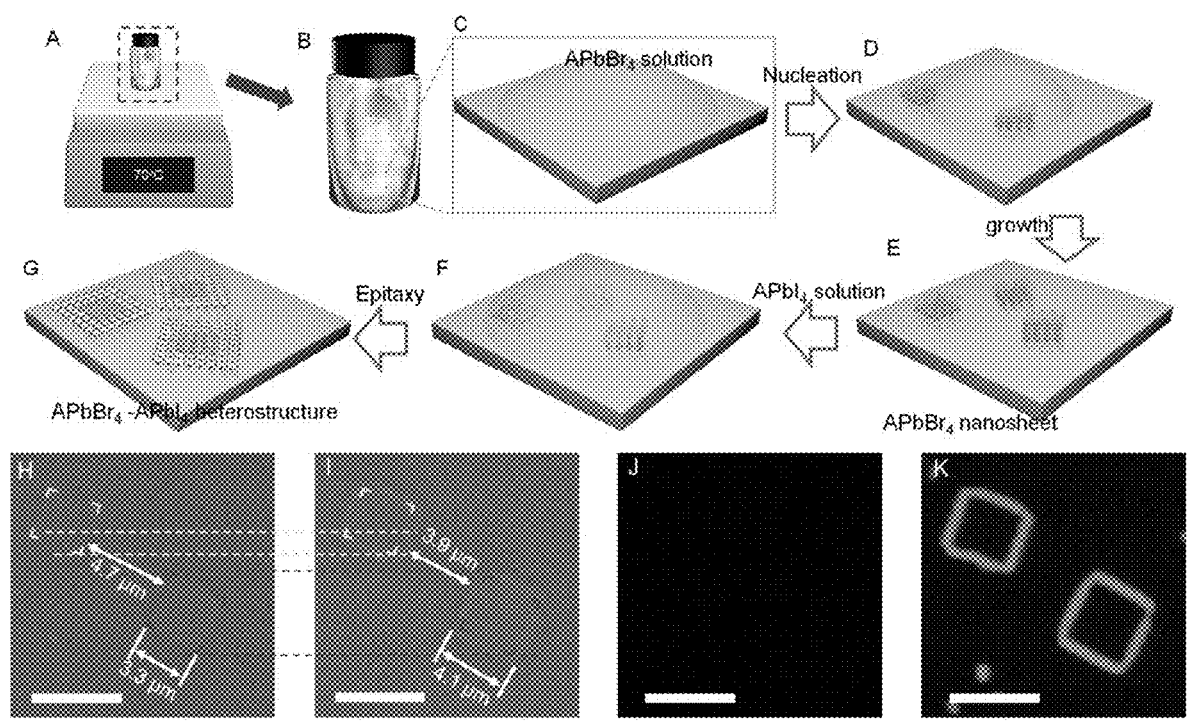
FIG. 4: Flow diagram of 2D lateral halide perovskite heterostructures $L_2PbI_4$-$L_2PbBr_4$ growth. (A, B) Schematics of the apparatus for 2D halide perovskite nanosheets and heterostructures growth. (C-G) Flow diagram of $L_2PbI_4$-$L_2PbBr_4$ growth (L=BA or 2T). (C) Adding 10 μL of $L_2PbBr_4$ precursor solution to grow $L_2PbBr_4$ nanosheets. (D) Nucleation of $L_2PbBr_4$ nanosheets with the evaporation of the co-solvents. (E) Formation of $L_2PbBr_4$ nanosheets on the substrate after all co-solvents are evaporated. (F) Adding 10 μL of diluted $L_2PbI_4$ precursor solution for the epitaxial growth of $L_2PbI_4$ from the existing $L_2PbBr_4$ nanosheets. (G) After the co-solvents are evaporated, $L_2PbI_4$-$L_2PbBr_4$ heterostructures are formed on the substrate. The growth of other types of 2D lateral halide perovskite heterostructures follows the same procedures. (H) Optical image of two $(2T)_2PbBr_4$ nanosheets grown on $SiO_2$/Si substrates. (I) Optical image of $(2T)_2PbBr_4$-$(2T)_2PbI_4$ heterostructures after epitaxial growth of $(2T)_2PbI_4$ from the existing $(2T)_2PbBr_4$ nanosheets. The dashed yellow and red frames indicate the outline of $(2T)_2PbBr_4$ nanosheets. The separation between these two $(2T)_2PbBr_4$ nanosheets was 4.7 μm initially and narrowed down to 3.9 μm after heterostructure formation. And the lateral length of right nanosheet was 3.3 μm and increased to 4.1 μm after the heterostructure formation. The above data rule out the possibility of ion exchange mechanism and further validates the epitaxial growth mechanism. (J, K) Corresponding PL images of $(2T)_2PbBr_4$ nanosheets and $(2T)_2PbBr_4$-$(2T)_2PbI_4$ heterostructures. The scale bars are 5 μm.
Figure 5:
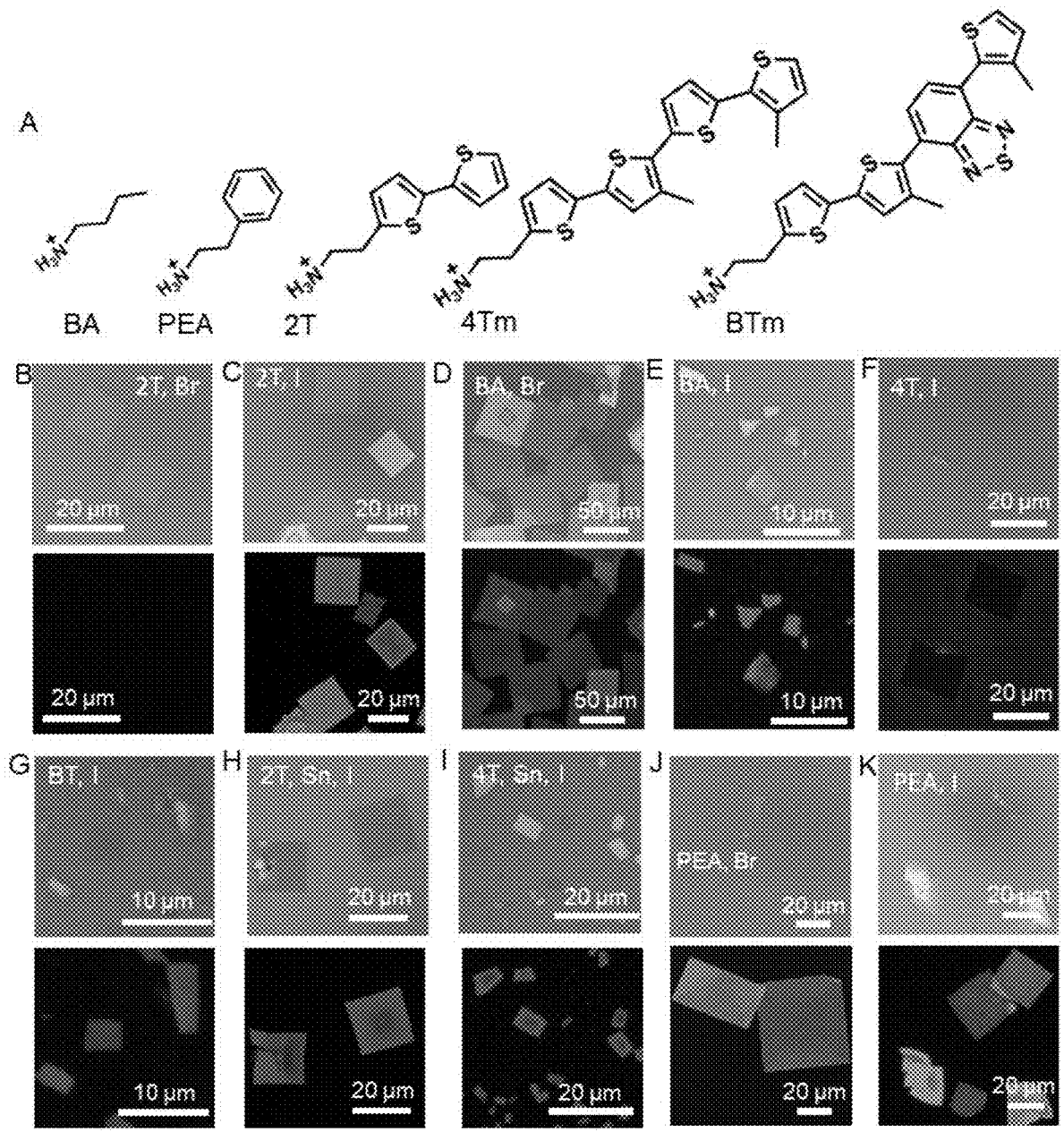
FIG. 5: Optical and PL images of 10 types of pure 2D halide perovskite nanosheets. (A) Five organic ligands involved in the 2D perovskites and heterostructures synthesis in our study, including $BA^+$, $PEA^+$, $2T^+$, $4Tm^+$ and $BTm^+$ ligands. (B) Optical and PL images of $(2T)_2PbBr_4$ nanosheets. The PL emission is quenched due to type-II band alignment between the inorganic $[PbBr_4]^{2-}$ and organic ligand $2T^+$ layers. (C) Optical and PL images of $(2T)_2PbI_4$ nanosheets. (D) Optical and PL images of $(BA)_2PbBr_4$ nanosheets. (E) Optical and PL images of $(BA)_2PbI_4$ nanosheets. (F) Optical and PL images of $(4Tm)_2PbI_4$ nanosheets. The PL emission is quenched type-II band alignment between the inorganic $[PbI_4]^{2-}$ and organic ligand $4Tm^+$ layers. (G) Optical and PL images of $(BTm)_2PbI_4$ nanosheets. The red emission comes from organic ligand $BTm^+$ layer as $[PbI_4]^{2-}$ layer and $4Tm^+$ layer forms type-I band alignment and $BTm^+$ layer possesses lower bandgap. (H) Optical and PL images of $(2T)_2SnI_4$ nanosheets. (I) Optical and PL images of $(4Tm)_2SnI_4$ nanosheets. (J) Optical and PL images of $(PEA)_2PbBr_4$ nanosheets. (K) Optical and PL images of $(PEA)_2PbI_4$ nanosheets.

The synthesis of 2D lateral halide perovskite heterostructures is performed via a solution-phase sequential growth approach, as shown in FIG. 4. In general, halide perovskites are susceptible to damage after two or more sequential growth steps. It is inevitable that the existing crystal blocks can be damaged when the subsequent growth is performed in a more aggressive condition (e.g. higher temperature or more polar solvent) than the prior step. To eliminate the possibility of damaging the existing crystals, the subsequent growth is performed under milder growth conditions, i.e., lowering the growth temperature or adding more antisolvent in the precursor's solution. Thus, the subsequent halide perovskites are nucleated along the edges of the prior 2D crystals, thereafter, forming concentric square/rectangular 2D heterostructures directly on the growth substrate ($SiO_2$/Si)

As shown in FIGS. 1A and 1B, two types of lateral 2D halide perovskite heterostructures are created using different organic ligands: a conjugated ligand based on bithiophenylethylammonium (2T, FIG. 1A) and a widely studied alkyl ligand butylammonium (BA, FIG. 1B). The heterostructures exhibit two concentric regions with slight optical contrast and distinct PL emissions, including the central square/rectangular bromide region and the peripherical iodide region with a uniform width of 1-2 μm (FIGS. 1C, 1D, 1E and 1F). For $(2T)_2PbI_4$-$(2T)_2PbBr_4$ heterostructure, no PL emission is detected from the central $(2T)_2PbBr_4$ region, which is attributed to type-II band alignment between the inorganic $[PbBr_4]^{2-}$ and organic ligand $2T^+$ layers. The sequence of the two steps for heterostructure formation (bromide followed by iodide vs. iodide followed by bromide) is dictated by the solubility difference of the two halide perovskites in the solvent system. Since $(2T)_2PbBr_4$ has a lower solubility in the quaternary solvent, it is synthesized prior to $(2T)_2PbI_4$. Unlike $(2T)_2PbBr_4$, $(2T)_2PbI_4$ has a green PL emission (FIG. 1D, 1I) peaking at 515 nm because of the type-I band alignment between $[PbI_4]^{2-}$ and $2T^+$ layers. The creation of $(BA)_2PbI_4$-$(BA)_2PbBr_4$ heterostructure follows the similar synthetic procedure. Due to the difference in band alignment compared with $(2T)_2PbBr_4$, the PL emission from $(BA)_2PbBr_4$ is not quenched but has a purple-blue color peaking at 409 nm, while the green PL emission from the $(BA)_2PbI_4$ is close to that of $(2T)_2PbI_4$ (FIGS. 1D & 1F).

It is known that the Br—I heterostructure is not thermally stable in perovskite nanowires because of the large solid-state diffusivity of Br and I anions. Interdiffusion of halide anions across the heterojunction can be triggered and accelerated upon mild heating. Here, surprisingly, it is found that when the conjugated 2T ligands are used, the interdiffusion between Br and I anions in the $(2T)_2PbI_4$-$(2T)_2PbBr_4$ heterostructure is significantly inhibited. As shown in FIG. 1G, after heating at 100° C. for 1 h, no difference is observed in the PL image, and the PL emission shift is within 1 nm (FIG. 1I), suggesting negligible halide interdiffusion across $(2T)_2PbI_4$-$(2T)_2PbBr_4$ interface. The halide interdiffusion dynamics in $(2T)_2PbI_4$-$(2T)_2PbBr_4$ heterostructures at different temperatures was also tracked for long time. Almost no change was found in the PL images as well as the PL spectra at both 75 and 100° C. In contrast, the halide interdiffusion is fast in the reference heterostructure $(BA)_2PbI_4$-$(BA)_2PbBr_4$. As shown in FIGS. 1H and 1I, after 1 h of heating at 100° C., the interface between the blue region associated with $(BA)_2PbBr_4$ and green region associated with $(BA)_2PbI_4$ becomes blurry and there is a drastic change in the PL spectrum. The green peak which was initially located at 516 nm has a blue shift to 495 nm, while the blue peak redshifts from 411 to 415 nm. Meanwhile, the peaks become significantly broader, indicating pronounced I/Br alloying. The halide interdiffusion dynamics of $(BA)_2PbI_4$-$(BA)_2PbBr_4$ heterostructure at different temperatures was also tracked.

Molecular dynamics (MD) simulations were used to further understand the effective inhibition of halide interdiffusion in the $(2T)_2PbI_4$-$(2T)_2PbBr_4$ heterostructure. The MD simulations on heterostructures of $(2T)_2PbI_4$-$(2T)_2PbBr_4$ and $(BA)_2PbI_4$-$(BA)_2PbBr_4$ at both room and elevated temperatures are consistent with the experimental observations: for $(2T)_2PbI_4$-$(2T)_2PbBr_4$, no diffusion is observed at either temperature, while halide diffusion across the junction is observed in $(BA)_2PbI_4$-$(BA)_2PbBr_4$ at elevated temperatures. As shown visually in FIGS. 1J and 1K, the identity of the organic ligand strongly impacts the amount of disorder at the interface and the elasticity of the inorganic framework. In $(2T)_2PbI_4$-$(2T)_2PbBr_4$, the interface remains pristine and well ordered. However, in $(BA)_2PbI_4$-$(BA)_2PbBr_4$ at the elevated temperature, the interface is disordered and diffusion of iodine into the bromide perovskite can be seen. As a measure of the elasticity of the inorganic framework, the vertical displacements of the lead atoms from their initial positions were monitored during the final nanosecond of the simulation. It is also found that the displacements for $(2T)_2PbI_4$-$(2T)_2PbBr_4$ are small (less than 2 Å) at both room and elevated temperatures; this is in contrast with $(BA)_2PbI_4$-$(BA)_2PbBr_4$ which shows a broad distribution of displacements at room temperature and an even broader distribution at the elevated temperature. The larger organic ligand is thus able to stabilize the interface and inorganic framework more effectively, while the smaller organic ligand leads to a softer inorganic lattice. As the perovskite octahedrons are much easier to distort geometrically in $(BA)_2PbI_4$-$(BA)_2PbBr_4$, the inorganic lattice is able to accommodate the mismatch in halide sizes and promote interdiffusion.

MD simulations on pure perovskite systems (i.e., containing only one halide species and not a heterostructure) were also used to shed light on halide and ligand vacancy formation as a function of the organic ligand. It was found that the free energy for removing an organic ligand from the surface to generate a vacancy is similar for both BA and 2T ligands for a given halide species. However, the free energy to remove a halide depends on the organic ligand (FIG. 1L). With the BA ligand the energetic cost to generate halide vacancies is much lower compared to the case with 2T ligand. From these calculations, the number of ligand vacancies is expected to be similar upon heating the crystals, while a greater concentration of halide vacancies is to be expected in $(BA)_2PbI_4$-$(BA)_2PbBr_4$ heterojunctions, which lead to a faster anion interdiffusion. Therefore, both the lower interfacial disorder and the lower halide vacancy concentration could contribute to the inhibition of the interdiffusion in the $(2T)_2PbI_4$-$(2T)_2PbBr_4$ heterojunctions.

Energy dispersive X-ray spectroscopy (EDS) and selected area electron diffraction (SAED) were used to provide structural insights in $(2T)_2PbI_4$-$(2T)_2PbBr_4$ heterostructures. From the low-magnification TEM image and EDS elemental mappings of a $(2T)_2PbI_4$-$(2T)_2PbBr_4$ heterostructure (FIG. $2A_1$-$2A_5$), Pb is distributed uniformly throughout the heterostructure while I and Br are concentrated at peripheral and central regions, respectively, which is consistent with PL, X-ray diffraction (XRD), and scanning electron microscopy (SEM) characterizations (FIG. 1). To avoid the structural damage from the electron beams, the SAED patterns were obtained with reduced electron dose-rate (less than 0.1 $e^-Å^{-2} s^{-1}$). The zone axis for diffraction is determined to be [114]. The slight difference in SAED patterns between pure $(2T)_2PbI_4$ and $(2T)_2PbBr_4$ nanosheets is attributed to their lattice mismatch (about 5%). For the $(2T)_2PbI_4$-$(2T)_2PbBr_4$ interface, the SAED pattern (FIG. 2B) is composed of two sets of patterns with identical orientation from $(2T)_2PbI_4$ and $(2T)_2PbBr_4$, respectively, confirming the epitaxial growth of $(2T)_2PbI_4$ from $(2T)_2PbBr_4$ nanosheet.

Figure 2:
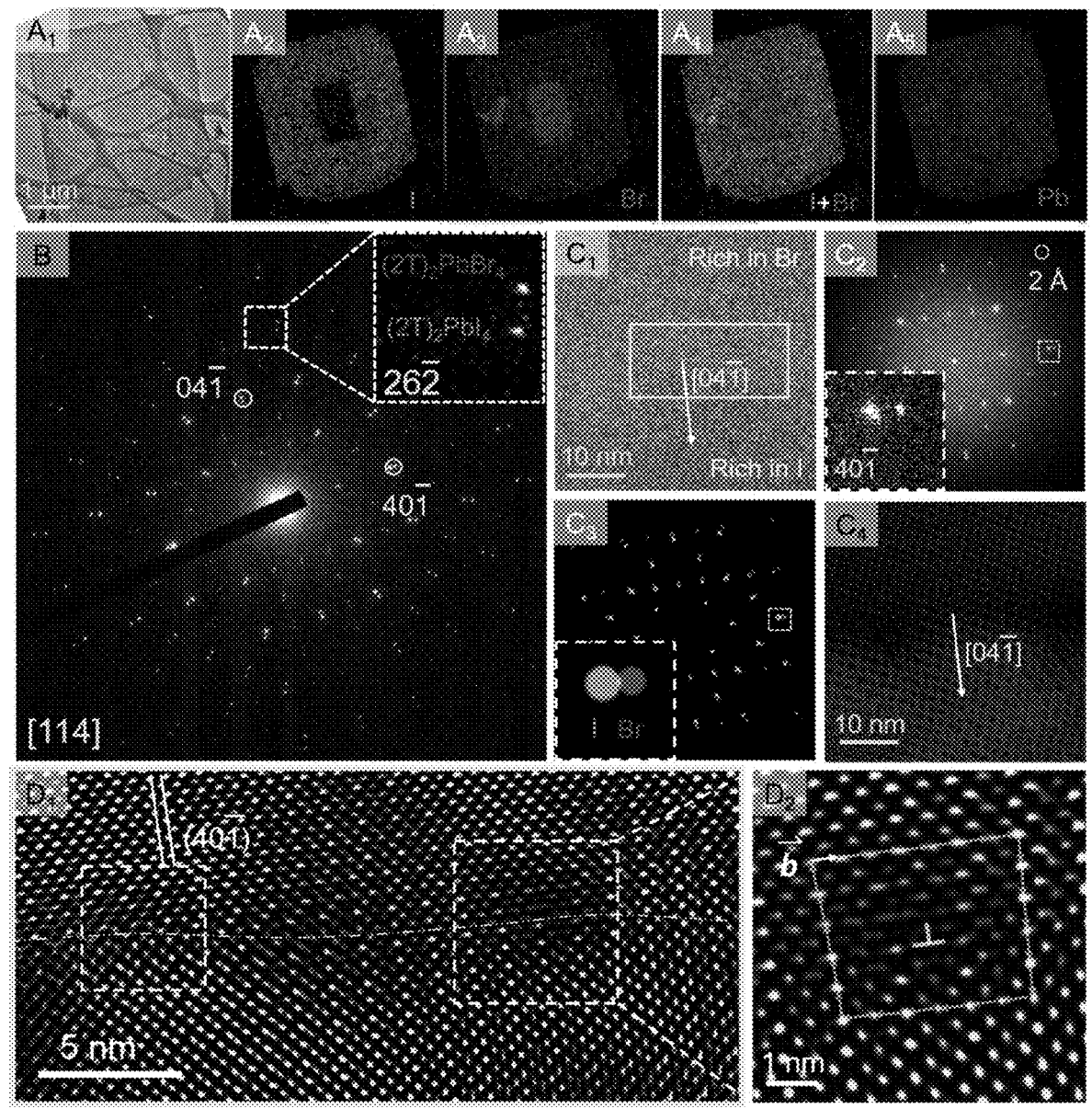
FIG. 2: TEM characterization of the $(2T)_2PbI_4$-$(2T)_2PbBr_4$ heterostructure. (A) Low-magnification TEM image (Ai) and EDS elemental mappings of one $(2T)_2PbI_4$-$(2T)_2PbBr_4$ heterostructure, where $A_2$, $A_3$, $A_4$ and $A_5$ represent the elemental mapping of Br, I, Br+I, and Pb, respectively; (B) SAED pattern of the $(2T)_2PbI_4$-$(2T)_2PbBr_4$ interface. Inset is the enlarged view of one pair of splitting diffraction spots. The zone axis is [114]; (C) AC-HRTEM and Fourier analysis. ($C_1$) A selected AC-HRTEM image; ($C_2$) FFT pattern. One pair of splitting spots is enlarged; ($C_3$) False-colored Fourier masks for two sets of spots. One pair of masks for splitting spots is enlarged; ($C_4$) Corresponding overlap of two sets of lattice fringes from $(2T)_2PbI_4$ and $(2T)_2PbBr_4$, respectively. False color is used for clearly distinguish $(2T)_2PbI_4$ from $(2T)_2PbBr_4$. ($D_1$) Fourier filtered and magnified AC-HRTEM image showing the epitaxial interface. ($D_2$) Enlarged image of an edge dislocation. The white arrow denotes the Burger vector $\vec{b}$.

To achieve higher spatial resolution of the heterostructure interface, low dose AC-HRTEM was performed at 80 kV (FIG. 2C, 2D). The continuous lattice fringes can be imaged at the $(2T)_2PbI_4$-$(2T)_2PbBr_4$ interface (FIG. $2C_1$) and its corresponding fast Fourier transform (FFT) information (FIG. $2C_2$) is consistent with the SAED pattern (FIG. 2B), further confirming the epitaxial growth between $(2T)_2PbBr_4$ and $(2T)_2PbI_4$ at nanometer scale. Moreover, Fourier filtering technique was utilized to further resolve the interface. Due to the different lattice constants between the two segments across the interface, the lattice information in real space is detached by applying well-tuned masks in Fourier transform space. The masked green and red areas in FIG. $2C_3$ correspond to the lattice information from $(2T)_2PbI_4$ and $(2T)_2PbBr_4$, respectively. By superimposing the two inverse FFT images, the near atomically sharp interface can be better distinguished (FIG. $2C_4$). The clear interface is also observed in the strain map. The phase image revealed the relatively uniform lattice of the $(2T)_2PbBr_4$ and periodic lattice deformation of the epitaxial $(2T)_2PbI_4$. In order to relax the accumulated interfacial strain and stabilize the heteroepitaxy, the existence of periodic interfacial misfit dislocations could be expected. This is evidenced by our direct observations shown in the Fourier filtered AC-HR-TEM images (FIG. 2D). FIG. 2D clearly demonstrates a misfit edge dislocation at an atomic level. In addition to the continuous lattice fringe along the (401) plane on both sides of the interface, the edge dislocations appear in about 15 nm interval. Furthermore, by analyzing multiple nanosheets, it is found that the $(2T)_2PbI_4$ preferentially grew along two certain directions ([041] and [$\bar{4}$01]). Thereby, a possible structural model of the stable heteroepitaxy is proposed that the two similar perovskite structures are in-plane connected along [041] and [401] directions with misfit dislocations to relax the interfacial strain, and out-of-plane strain may be relaxed by slightly adjusting the orientations of the organic cations.

Figure 3:
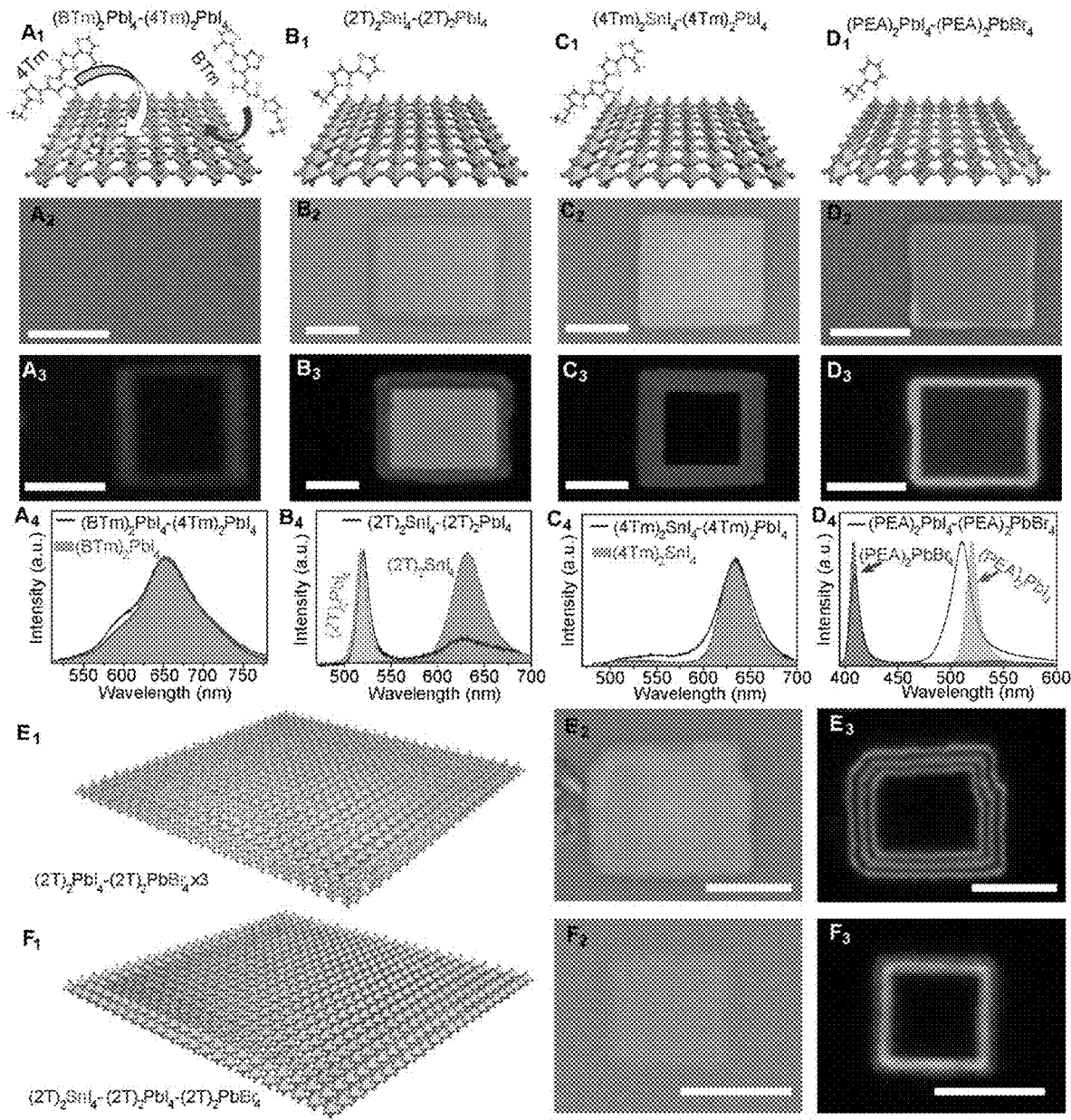
FIG. 3: The library of 2D halide perovskite lateral heterostructures, multi-heterostructures and superlattices. (A) $(BTm)_2PbI_4$-$(4Tm)_2PbI_4$ lateral heterostructure; (B) $(2T)_2SnI_4$-$(2T)_2PbI_4$ lateral heterostructure; (C) $(4Tm)_2SnI_4$-$(4Tm)_2PbI_4$ lateral heterostructure; (D) $(PEA)_2PbI_4$-$(PEA)_2PbBr_4$ lateral heterostructure; (E) $(2T)_2PbI_4$-$(2T)_2PbBr_4$ lateral superlattice; (F) $(2T)_2SnI_4$-$(2T)_2PbI_4$-$(2T)_2PbBr_4$ lateral multi-heterostructure. $A_1$, $B_1$, $C_1$, $D_1$, $E_1$, $F_1$ are schematic representations, $A_2$, $B_2$, $C_2$, $D_2$, $E_2$, $F_2$ are optical images, $A_3$, $B_3$, $C_3$, $D_3$, $E_3$, $F_3$ are PL images, $A_4$, $B_4$, $C_4$, $D_4$ are PL spectrum. Scale bars are 3 μm in A and F, and are 5 μm in B, C, D and E. Scale bars for A and F are 3 μm. All other scale bars are 5 μm.

This disclosure further demonstrates the general synthesis of a variety of lateral heterostructures (between different halides, metal cations, and organic ligands) and even superlattices of 2D halide perovskites following the solution-phase epitaxial growth strategy. Additional conjugated organic ligands, including phenylethylammonium ($PEA^+$), quaterthiophenylethylammonium ($4Tm^+$) and 7-(thiophen-2-yl)benzothiadiazol-4-yl)-[2,2'-bithiophen]-5-yl)ethylammonium ($BTm^+$) were used. The chemical structures of exemplified ligands in this disclosure are listed in FIG. 5A. Corresponding optical and PL images of each type of 2D nanosheet are shown in FIG. 5B-5K. The XRD patterns and PL spectra of these 2D nanosheets are summarized in FIG. 6. Based on these, this disclosure provides synthesis of $(BTm)_2PbI_4$-$(4Tm)_2PbI_4$ heterostructure between different organic ligands, synthesis of $(2T)_2SnI_4$-$(2T)_2PbI_4$ and $(4Tm)_2SnI_4$-$(4Tm)_2PbI_4$ heterostructures between different metal cations, synthesis of $(PEA)_2PbI_4$-$(PEA)_2PbBr_4$ heterostructure between different halides, $(2T)_2PbI_4$-$(2T)_2PbBr_4$-$(2T)_2PbI_4$-$(2T)_2PbBr_4$-$(2T)_2PbI_4$-$(2T)_2PbBr_4$ superlattices ($(2T)_2PbI_4$-$(2T)_2PbBr_4 \times 3$), and $(2T)_2SnI_4$-$(2T)_2PbI_4$-$(2T)_2PbBr_4$ multi-heterostructures (FIG. 3).

Figure 6:
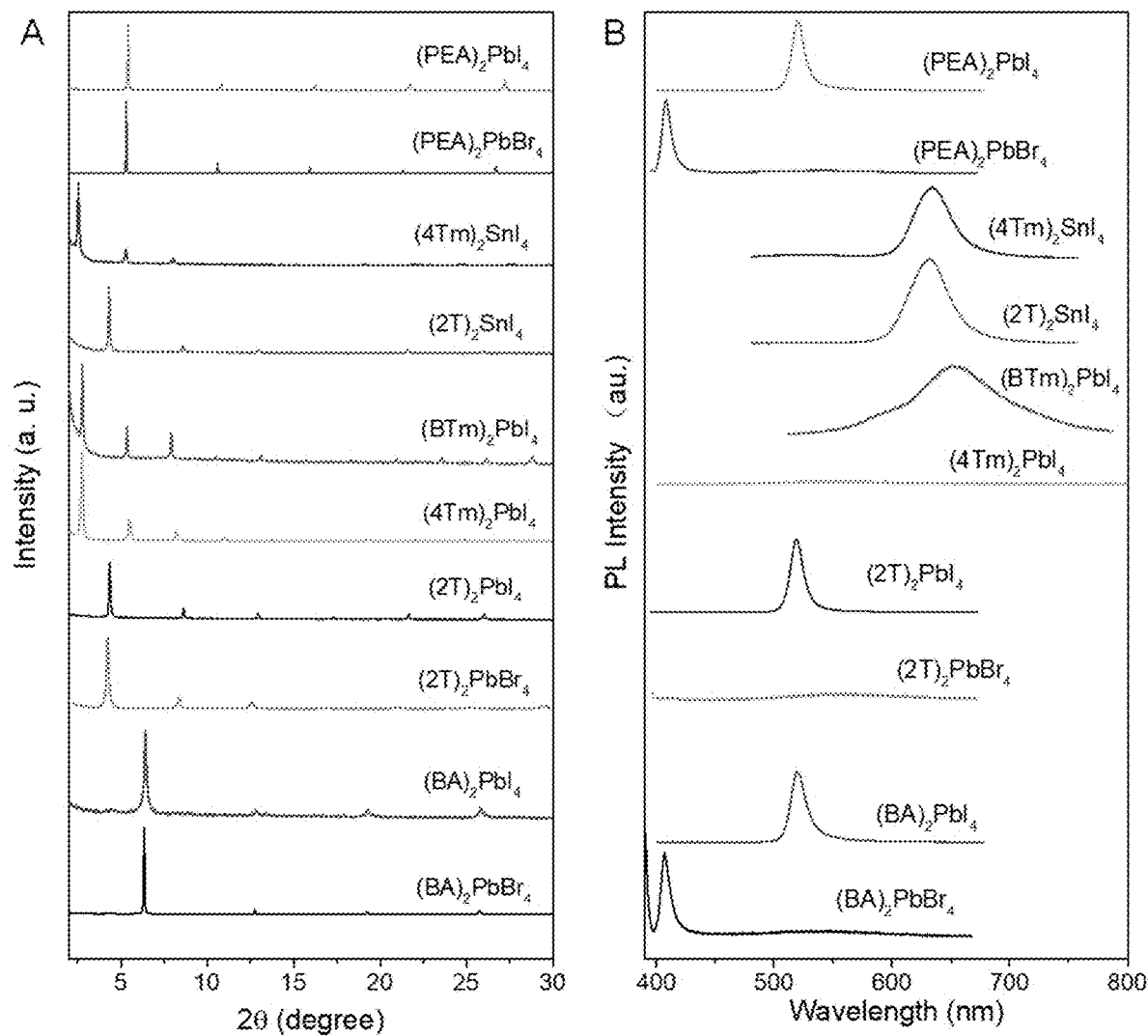
FIG. 6. XRD profiles (A) and PL spectra (B) of 10 types of pure 2D halide perovskite nanosheets. The periodic XRD peaks of these 2D halide perovskite nanosheets are indications of layered structures, and the interlayer spacings can be calculated from these peaks. All the nanosheets except $(2T)_2PbBr_4$ and $(4Tm)_2PbI_4$, have strong PL emission.

As shown in FIG. 3A ($A_1$-$A_4$), the lateral heterostructures can be created between two segments with distinct organic ligands, $4Tm^+$ and $BTm^+$. $(4Tm)_2PbI_4$ region shows no PL emission due to the type-II band alignment between $4Tm^+$ ligand and $[PbI_4]^{2-}$ layers (FIG. 5F and FIG. 6). The broad red PL emission from the peripheral region of the heterostructure originates from $(BTm)_2PbI_4$, which is attributed to the type-I band alignment with $BTm^+$ layer having lower bandgap (FIG. 5I and FIG. 6). In addition, the bandgap and optoelectronic properties of halide perovskite materials can be effectively modulated by altering the metal atoms centering the $[MX_4]^{2-}$ octahedrons. Sn-based halide perovskites are environmentally benign, and possess lower bandgaps and higher carrier mobilities compared with their Pb-counterparts. By substituting Pb with Sn, 2D halide perovskite nanosheets have been successfully synthesized with $2T^+$ and $4Tm^+$ ligands, including $(2T)_2SnI_4$ and $(4Tm)_2SnI_4$ (FIG. 5H and FIG. 5I). In combination with the Pb-based perovskites, both lateral $(2T)_2SnI_4$-$(2T)_2PbI_4$ and $(4Tm)_2SnI_4$-$(4Tm)_2PbI_4$ heterostructures have been created (FIGS. 3B and 3C). Two distinct PL emission peaks from $(2T)_2SnI_4$-$(2T)_2PbI_4$ heterostructure correspond to pure $(2T)_2SnI_4$ and $(2T)_2PbI_4$, and the gap in the PL image between Pb and Sn perovskite segments is probably induced by energy transfer or exciton dissociation at the interface. Similarly, Pb and Sn perovskite segments in $(4Tm)_2PbI_4$-$(4Tm)_2SnI_4$ heterostructure exhibit slight contrast in the optical image and distinct emission color in the PL image (FIG. 3C). The peripheral region has the identical PL spectrum with the reference $(4Tm)_2SnI_4$ crystal (FIG. 5I). Another smaller conjugated ligand $PEA^+$ is used to construct lateral heterostructure between Br and I components. As shown in FIG. 3D, the PL image and spectrum of $(PEA)_2PbI_4$-$(PEA)_2PbBr_4$ heterostructure are close to those of $(BA)_2PbI_4$-$(BA)_2PbBr_4$, showing purple-blue color in the central and green on the peripheral region. Apart from the two-segment concentric heterostructures, more complex heterostructures, such as superlattices and 3-segment multi-heterostructures, have also been demonstrated. As shown in FIG. 3E, the $(2T)_2PbI_4\text{-}(2T)_2PbBr_4\times 3$ superlattice is synthesized through multiple repeated growth steps. As indicated in the schematic illustration and the PL image, 6 concentric rectangles are formed, with green emission regions representing $(2T)_2PbI_4$ and quenched regions representing $(2T)_2PbBr_4$. Additionally, multi-heterostructures are realized by the 3$^{rd}$ growth of $(2T)_2SnI_4$ layer with red emission along $(2T)_2PbI_4\text{-}(2T)_2PbBr_4$ heterostructure (FIG. 3F). Additionally, the yields of the above-mentioned heterostructures synthesis are very high, as illustrated in the lower magnification optical and PL images.

The thickness of the heterostructures can be controlled from a single to a few unit cells. For example, for the $(BTm)_2PbI_4\text{-}(4Tm)_2PbI_4$ and $(4Tm)_2SnI_4\text{-}(4Tm)_2PbI_4$ heterostructures, the 6-7 nm thickness determined from the AFM characterizations indicates the 2D crystals are within a single unit cell thickness. Besides, the thickness of $(2T)_2PbI_4\text{-}(2T)_2PbBr_4$ and $(PEA)_2PbI_4\text{-}(PEA)_2PbBr_4$ examples is around 15 nm, which is of several unit-cell thickness along the out-of-plane direction. In addition to the spatially resolved composition and PL, these novel 2D heterostructures may exhibit unique photophysical properties. For instance, the longer exciton lifetime at the interface of $(2T)_2PbBr_4\text{-}(2T)_2PbI_4$ and $(4Tm)_2SnI_4\text{-}(4Tm)_2PbI_4$ heterostructures observed in fluorescence lifetime imaging measurements shed light on the possibility of tuning the optoelectronic properties via strain engineering at the interfaces.

The present disclosure therefore has shown that the ion interdiffusion across 2D halide perovskite heterojunctions can be effectively inhibited by utilizing rigid conjugated ligands in the 2D perovskite structure. This suppression of ion migration may benefit photovoltaic and other electronics device research. Stable and near-atomically sharp interfaces can be obtained via sequential epitaxial growth. The generic synthesis of a wide range of 2D lateral halide perovskite heterostructures, superlattices, and multi-heterostructures not only presents a powerful platform for advancing fundamental crystal chemistry of halide perovskites, but also opens up the possibility of further exploring their optoelectronic properties and their applications in diodes, lasers, transistors and photovoltaic devices. More importantly, these findings and methodologies may be extended to other classes of solution-processed 2D nanomaterials.

In one embodiment, the present disclosure provides a two-dimensional halide perovskite material, comprising:

a first halide perovskite component of formula $L_2A_{n-1}M_nX_{3n+1}$ and a second halide perovskite component of formula $L'_2A'_{n'-1}M'_{n'}X'_{3n'+1}$, wherein:

L represents a conjugated organic ligand cation of a conjugated and optionally substituted aryl and/or hetero aryl system, wherein each aryl and/or hetero aryl ring in the conjugated and optionally substituted aryl or hetero aryl system may be same or different;

L' represents a conjugated or a non-conjugated organic ligand cation;

A and A' each independently represents a cation Cs$^+$, Rb$^+$, CH$_3$NH$_3$+, CH$_3$CH$_2$NH$_3^+$, or

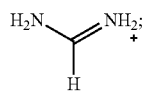

M and M' each independently represents a divalent metal cation Pb$^{2+}$, Sn$^{2+}$, Ge$^{2+}$, Cu$^{2+}$, Zn$^{2+}$, Cd$^{2+}$, Hg$^{2+}$, Ni$^{2+}$, Co$^{2+}$, Fe$^{2+}$, Mn$^{2+}$, Cr$^{2+}$, V$^{2+}$; Pd$^{2+}$; Pt$^{2+}$;

X and X' each independently represents F$^-$, Cl$^-$, Br$^-$ or I$^-$;

n and n' each independently is 1-6; and wherein the first halide perovskite component and the second halide perovskite component are not the same perovskite, and the first halide perovskite is first formed as a lateral core and the second halide perovskite is formed surrounding the lateral core of the first halide perovskite.

In one embodiment regarding the two-dimensional halide perovskite material, the aryl comprises at least one phenyl ring, the hetero aryl comprises at least one thiophenyl ring.

In one embodiment regarding the two-dimensional halide perovskite material, L represents a cation of a hetero aryl system comprising at least two thiophenyl rings.

In one embodiment regarding the two-dimensional halide perovskite material, L represents a cation of a hetero aryl system comprising at least one of (NH$_3$)$^+$, [C(NH$_2$)$_2$]$^-$, or

In one embodiment regarding the two-dimensional halide perovskite material, L represents an asymmetric mono-ammonium cationic moiety:

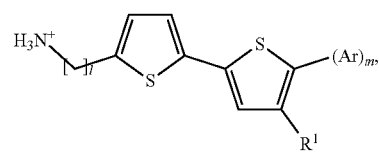

I wherein R$^1$ is —H, —F, —Cl, —Br, —I, -Me, -Et, -OMe, -OEt, -SMe, -SEt, —CN, —NO$_2$, -COMe, —CHO, -COOMe, or —NH-COMe;

(Ar)$_m$ represents a conjugated and optionally substituted aryl or hetero aryl system, or a combination thereof, wherein each aryl or hetero aryl ring in the conjugated and optionally substituted aryl or hetero aryl system may be same or different;

L is 1-4; and m is 0-5.

In one embodiment regarding the two-dimensional halide perovskite material when L is represented by formula I, R$^1$ is —F, —Cl, —Br, —I, -Me, -Et, -OMe, -OEt, -SMe, -SEt, —CN, —NO$_2$, -COMe, —CHO, -COOMe, or —NH-COMe. In one aspect, R$^1$ is -Me.

In one embodiment regarding the two-dimensional halide perovskite material when L is represented by formula I, wherein (Ar)$_m$ represents a conjugated and optionally substituted aryl or hetero aryl system, or a combination thereof, wherein each aryl or hetero aryl ring in the conjugated and optionally substituted aryl or hetero aryl system may be same or different, wherein aryl is phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, naphthyl, or any combination thereof; wherein hetero aryl is pyrrolidinyl, azetidinyl, piperidynyl, piperazinyl, morpholinyl, chromanyl, indolinonyl, isoindolinonyl, furanyl, pyrrolidinyl, pyridinyl, pyrazinyl, pyrimidinyl, triazinyl, thiophenyl, tetrahydrofuranyl, pyrrolyl, oxazolyl, oxadiazolyl, imidazolyl, triazyolyl, tetrazolyl, benzoxazolinyl, benzthiazolinyl, and benzimidazolinyl groups.

In one embodiment regarding the two-dimensional halide perovskite material when L is represented by formula I, wherein (Ar)$_m$ represents a conjugated and optionally substituted aryl or hetero aryl system, or a combination thereof, wherein each aryl or hetero aryl ring in the conjugated and optionally substituted aryl or hetero aryl system may be same or different, wherein Ar is selected from the group consisting of:

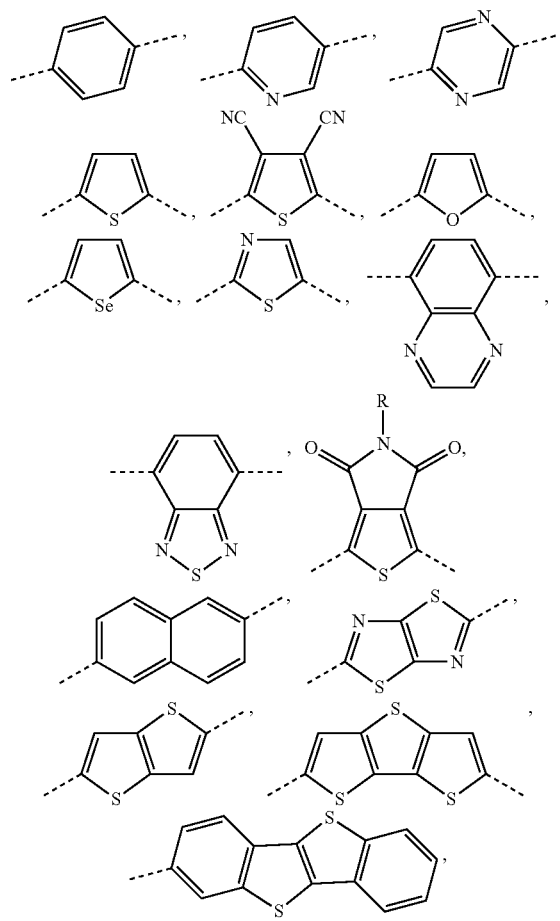

and any combination thereof. The dashed bonds shows possible connection between different aryl groups. It should be understood that the bond positions may not be limited to the as-drawn structures. In one aspect, one or more aryl group may be substituted by substituent groups such as —F, —Cl, —Br, —I, -Me, -Et, -OMe, -OEt, -SMe, -SEt, —CN, —NO$_2$, -COMe, —CHO, -COOMe, —NH-COMe, or any combination thereof.

In one embodiment regarding the two-dimensional halide perovskite material when L is represented by formula I, wherein L is:

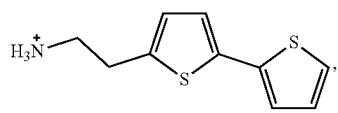

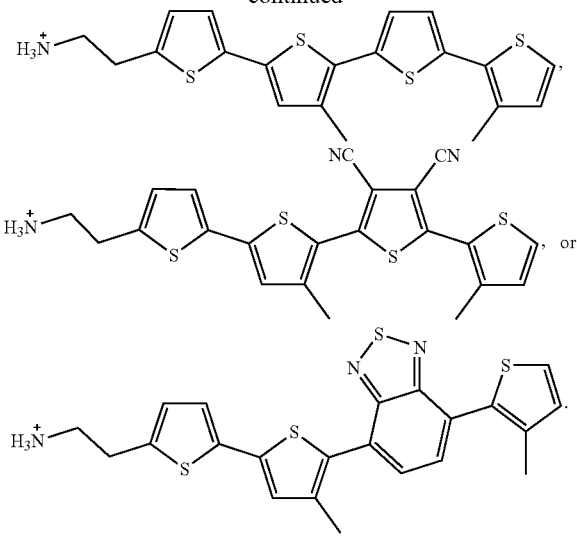

In one embodiment regarding the two-dimensional halide perovskite material, wherein L' may be any organic ligand cation as defined for "organic ligand cation" found in paragraph [0019]. L' may also be selected from a group as defined for group L, as far as L and L' are different in the same two-dimensional halide perovskite material.

In one embodiment regarding the two-dimensional halide perovskite material, the two-dimensional halide perovskite material may form nanometer, micrometer or even centimeter large sheets with thickness from 1 to 1000 nm, 1-750 nm, 1-500 nm, 1-250 nm, 1-100 nm, or 1-50 nm.

In one embodiment regarding the two-dimensional halide perovskite material, the lateral joint between the first and the second halide perovskite are substantially free of anion interdiffusion.

In one embodiment, the present disclosure provides a solution-phase synthetic method of preparing the two-dimensional halide perovskite material of any embodiment of this disclosure, wherein the method comprises:

providing a solution of a first precursor and a first solvent system for preparing the first halide perovskite component of formula $L_2A_{n-1}M_nX_{3n+1}$;

adding the solution of the first precursor to a first container with a growth substrate for growing halide perovskite component;

placing the first container inside a second container with a second solvent system, wherein the second solvent system is not in direct contact with the solution of the first precursor and the second solvent system is served as an anti-solvent system for slowing down the evaporation of the first solvent system;

capping the second container and elevating the temperature of the second container to allow the growth of a nano-sheet of the first halide perovskite component;

cleaning the substrate with the nano-sheet of the first halide perovskite component and making it ready for growing of the second halide perovskite component of formula $L'_2A'_{n'-1}M'_nX'_{3n'+1}$; and repeating substantial the same steps to make the second halide perovskite component of formula $L'_2A'_{n'-1}M'_nX'_{3n'+1}$ surrounding the lateral core of the first halide perovskite.

In one embodiment regarding the solution-phase synthetic method, wherein the growth substrate is a SiO2 substrate.

In one embodiment regarding the solution-phase synthetic method, wherein solution concentration for making the second halide perovskite component of formula $L'_2A'_{n'-1}M'_nX'_{3n'+1}$ is lower than the concentration for making the first halide perovskite component of formula $L_2A'_{n-1}M_nX_{3n+1}$.

In one embodiment regarding the solution-phase synthetic method, wherein temperature for making the second halide perovskite component of formula $L'_2A'_{n'-1}M'_nX'_{3n'+1}$ is lower than temperature for making the first halide perovskite component of formula $L_2A'_{n'-1}M_nX'_{3n'+1}$.

In one embodiment regarding the solution-phase synthetic method, wherein the first solvent system comprises four organic solvent chlorobenzene, dimethylformide, acetonitrile, and dichlorobenzene, and the second solvent system comprises chlorobenzene.

In one embodiment, the present disclosure provides a method of using the two-dimensional halide perovskite material of any embodiment of this disclosure, wherein the two-dimensional halide perovskite material is used for light-emitting diodes, lasers, infrared photodetectors, transistors, thermoelectric devices, or solar cells.

Experimental and Methods

Solution-Phase Synthesis of Pure 2D Halide Perovskite Nanosheets

For illustration purpose in this disclosure, ten types of pure 2D halide perovskite nanosheets are synthesized via a quaternary solvent method.

Chemicals and reagents: The solvents, including anhydrous chlorobenzene (CB), dimethylformide (DMF), acetonitrile (AN) and dichlorobenzene (DCB), and solid chemicals, including lead bromide ($PbBr_2$), lead iodide ($PbI_2$) and tin iodide ($SnI_2$), are directly purchased from Sigma Aldrich. n-butylammonium bromide (BA.HBr), n-butylammonium iodide (BA.HI), phenethylammonium bromide (PEA.HBO and phenethylammonium iodide (PEA.HI) are purchased from Greatcell Solar Ltd. All above chemicals are used as received. Other ammonium salt ligands, including 2T.HI, 2T.HBr, 4Tm.HI and BTm—HI are synthesized following methods disclosed in the U.S. patent application Ser. No. 16/504,438.

Synthesis of 2D halide perovskite nanosheets: 10 µmol of $MX_2$ (M=Pb or Sn; X=Br or I) and 20 µmol of L.HX (L=BA, PEA, 2T, 4Tm or BTm; X=Br or I) are dissolved in 2 mL of DMF/CB co-solvent (1:1 volume ratio) to prepare 5 mM of stock solution. The stock solution is then diluted 120 times by CB/AN/DCB co-solvent (2.5:1:0.01 volume ratio). As shown in FIG. 1, 5-10 µL of the diluted solution is added onto the growth substrate $SiO_2$ (300 nm)/Si, which is placed at the bottom of a 4 mL glass vial. Then the 4 mL vial is transferred into a secondary glass vial (20 mL) containing 3 mL of CB. After that, the secondary vial is capped and moved onto 70° C. hot plate. The antisolvent (CB) inside the secondary vial will slow down the solvent evaporation from the substrate and facilitate the formation of large 2D halide perovskite nanosheets. The growth typically takes 10-30 min. Solution preparation and nanosheets growth are carried out in $N_2$-filling glovebox. The growth substrate is cleaned in piranha acid for 2 h prior to use.

The growth steps for all the nanosheets in are substantially the same. However, the growth parameters for some nanosheets are slightly different. The foregoing recipe applies to the growth of $(2T)_2PbBr_4$, $(BA)_2PbBr_4$, $(BA)_2PbI_4$ and $(PEA)_2PbBr_4$. For $(2T)_2PbI_4$, $(2T)_2SnI_4$ and $(PEA)_2PbI_4$, the stock solution is diluted 120 times by CB/AN/DCB co-solvent (9.5:1:0.01 volume ratio). For $(4Tm)_2PbI_4$ and $(4Tm)_2SnI_4$, the stock solution is diluted 240 times by CB/AN/DCB co-solvent (3.9:1:0.01 volume ratio) and the growth temperature is 90° C. For $(BTm)_2PbI_4$, the stock solution is diluted 1440 times by CB/AN/DCB co-solvent (7.4:1:0.01 volume ratio) and the growth temperature is 90° C.

For the quaternary solvent method for crystal growth, CB helps reduce the solubility of 2D perovskite in DMF and promotes the nanosheet crystallization. AN has a lower boiling point compared to CB, and 2D perovskite has a limited solubility in AN. In this case, AN evaporates more quickly and initiates the 2D perovskite nucleation at a relatively low concentration, thus decreasing the thickness of nanosheets. Moreover, compared to CB, DCB has a higher boiling point. The addition of DCB will avoid the gradually increasing concentration of perovskite solution with the evaporation of AN and CB, thus ensuring the uniform distribution of nanosheets throughout the growth substrate.

Epitaxial Synthesis of 2D Lateral Halide Perovskite Heterostructures

The epitaxial growth of 2D lateral halide perovskite heterostructures is based on the foregoing quaternary solvent method. The growth of 1$^{st}$ nanosheet is identical to above method. To eliminate the possibility of crystal damage, the subsequent growth is performed under milder growth conditions in our study, i.e. by lowering the growth temperature or adding more antisolvent in the solution.

$(2T)_2PbI_4$-$(2T)_2PbBr_4$ heterostructures: The $(2T)_2PbI_4$ stock solution is diluted 480 times by CB/AN/DCB co-solvent (6:1:0.01 volume ratio) for the growth of heterostructures. After the growth of $(2T)_2PbBr_4$ nanosheets, the hot plate was cooled down to 50° C. Then 10 µL of the diluted $(2T)_2PbI_4$ solution is added on the growth substrate. The epitaxial growth of $(2T)_2PbI_4$ along $(2T)_2PbBr_4$ nanosheets typically takes about 30 min. The $(2T)_2PbI_4$-$(2T)_2$ $PbBr_4 \times 3$ superlattices are realized by 3 repeated growth of $(2T)_2PbI_4$-$(2T)_2PbBr_4$ heterostructures.

$(BA)_2PbI_4$-$(BA)_2PbBr_4$ heterostructures: The $(BA)_2PbI_4$ stock solution is diluted 240 times by CB/AN/DCB co-solvent (6:1:0.01 volume ratio) for the growth of heterostructures. After the growth of $(BA)_2PbBr_4$ nanosheets, the hot plate was cooled down to 50° C. Then 10 µL of the diluted $(BA)_2PbI_4$ solution is added on the growth substrate. The epitaxial growth of $(BA)_2PbI_4$ along $(BA)_2PbBr_4$ nanosheets typically takes about 30 min.

$(BTm)_2PbI_4$-$(4Tm)_2PbI_4$ heterostructures: The $(BTm)_2PbI_4$ stock solution is diluted 1440 times by CB/AN/DCB co-solvent (3.2:1:0.01 volume ratio) for the growth of heterostructures. After the growth of $(4Tm)_2PbI_4$ nanosheets, the hot plate was cooled down to 50° C. Then 10 µL of the diluted $(BTm)_2PbI_4$ solution is added on the growth substrate. The epitaxial growth of $(BTm)_2PbI_4$ along $(4Tm)_2PbI_4$ nanosheets typically takes about 30 min.

$(2T)_2SnI_4$-$(2T)_2PbI_4$ heterostructures: The $(2T)_2SnI_4$ stock solution is diluted 120 times by CB/AN/DCB co-solvent (9.5:1:0.01 volume ratio) for the growth of heterostructures. After the growth of $(2T)_2PbI_4$ nanosheets, the hot plate was cooled down to 50° C. Then 10 µL of the diluted $(2T)_2SnI_4$ solution is added on the growth substrate. The epitaxial growth of $(2T)_2SnI_4$ along $(2T)_2PbI_4$ nanosheets typically takes about 30 min.

$(4Tm)_2SnI_4$-$(4Tm)_2PbI_4$ heterostructures: The $(4Tm)_2SnI_4$ stock solution is diluted 240 times by CB/AN/DCB co-solvent (1.8:1:0.01 volume ratio) for the growth of heterostructures. After the growth of $(4Tm)_2PbI_4$ nanosheets, the hot plate was cooled down to 80° C. Then 10 µL of the diluted $(4Tm)_2SnI_4$ solution is added on the growth substrate. The epitaxial growth of $(4Tm)_2SnI_4$ along $(4Tm)_2PbI_4$ nanosheets typically takes about 10 min.

$(PEA)_2PbI_4$-$(PEA)_2PbBr_4$ heterostructures: The $(PEA)_2PbI_4$ stock solution is diluted 240 times by CB/AN/DCB co-solvent (9.5:1:0.01 volume ratio) for the growth of heterostructures. After the growth of $(PEA)_2PbBr_4$ nanosheets, the hot plate was cooled down to 50° C. Then 10 μL of the diluted $(PEA)_2PbI_4$ solution is added on the growth substrate. The epitaxial growth of $(PEA)_2PbI_4$ along $(PEA)_2PbBr_4$ nanosheets typically takes about 30 min.

$(2T)_2SnI_4$-$(2T)_2PbI_4$-$(2T)_2PbBr_4$ multi-heterostructures: $(2T)_2SnI_4$ stock solution is diluted 480 times by CB/AN/DCB co-solvent (9.5:1:0.01 volume ratio) for the growth of multi-heterostructures. Following the growth of $£2T)_2PbI_4$-$(2T)_2PbBr_4$ heterostructures, 10 μL of the diluted $(2T)_2SnI_4$ solution is added on the growth substrate. The epitaxial growth of $(2T)_2PbI_4$ along $(2T)_2PbBr_4$ nanosheets typically takes about 30 min.

Characterizations: SEM, PL and OM, AFM, FLIM

Optical imaging: The bright-field optical images were collected by a custom Olympus BX53 microscope.

PL imaging and spectra collection: samples were excited with a fluorescence light source (012-63000; X-CITE 120 REPL LAMP). The filter cube contains a bandpass filter (330-385 nm) for excitation, and a dichroic mirror (cutoff wavelength: 400 nm) for light splitting and a filter (Long pass 420 nm) for emission. The PL spectra were collected by SpectraPro HRS-300 spectrometer.

SEM imaging: The back-scattering SEM images were collected by a FEI TeneoVS scanning electron microscope. The acceleration voltage is 1 kV, and the acceleration current is 0.1 nA.

Powder XRD measurements: Powder XRD was measured using Panalytical Empyrean powder X-ray diffractometer with a Cu Kα source.

Single-crystal XRD measurement of $(2T)_2PbBr_4$: Single crystals of $(2T)_2PbBr_4$ were analyzed by a Bruker Quest diffractometer with kappa geometry, an microsource X-ray tube, laterally graded multilayer (Goebel) mirror single crystal for monochromatization, a Photon2 CMOS area detector and an Oxford Cryosystems low temperature device. Examination and data collection were performed with Cu Kα radiation ($\lambda$=1.54178 Å) at 150 K.

Crystals of $(2T)_2PbBr_4$ are twinned by non-merohedry. Twinning is related to pseudotranslational symmetry along the b-axis only broken by modulation of the lead ions and of ethyl ammonium fragments. The basic cell exhibits monoclinic C-centered symmetry (a=42.990, b=5.817, 11.303, 90 93.95, 90). Monoclinic symmetry is broken by unit cell doubling, but crystals are twinned by a symmetry operation of the basic monoclinic cell. The main peaks of the basic cell are common to both twin domains (exact overlaps). Weak satellite reflections are "split" between twin domains.

Data were collected, reflections were indexed and processed, and the files scaled and corrected for absorption using APEX3. See Bruker (2018). Apex3 v2018.7-2, Saint V8.38A, Bruker AXS Inc.: Madison (Wis.), USA. The orientation matrices for the crystals under investigation were identified using the program Cell_Now. See Sheldrick, G. M. (2008). CELL_NOW. Version 2008/4. Georg-August-Universitat Gottingen, Gottingen, Germany. For the crystal chosen for analysis the two components are related by a 180° rotation around the reciprocal c-axis. The two components were integrated using Saint and corrected for absorption using Twinabs (See See Sheldrick, G. M. (2012). TWINABS. Version 2012/1. Georg-August-Universitat Gottingen, Gottingen, Germany), resulting in the following statistics:

25690 data (6880 unique) involve domain 1 only, mean I/sigma 27.9.

25419 data (6881 unique) involve domain 2 only, mean I/sigma 20.8.

31984 data (8392 unique) involve 2 domains, mean I/sigma 40.2.

33 data (33 unique) involve 3 domains, mean I/sigma 37.1.

The exact twin matrix identified by the integration program was found to be:

−0.99968-0.00087-0.00233
0.00165-0.99978-0.00085
−0.27874-0.49983 0.99946

The space group was assigned and the structure was solved using direct methods with only the non-overlapping reflections of component 1 using XPREP within the SHELXTL suite of programs. See SHELXTL suite of programs, Version 6.14, 2000-2003, Bruker Advanced X-ray Solutions, Bruker AXS Inc., Madison, Wis.: USA. and G. M. Sheldrick, A short history of SHELX. *Acta Crystallographica Section A: Foundations of Crystallography* 64, 112-122 (2008). The structure was refined by full matrix least squares against $F^2$ using the hklf 5 routine with all reflections of component 1 (including the overlapping ones) using Shelxl2018 (See Sheldrick GM. University of Gottingen, Germany, 2018, and G. M. Sheldrick, Crystal structure refinement with SHELXL. *Acta Crystallographica Section C: Structural Chemistry* 71, 3-8 (2015)). and the graphical interface Shelxle (See C. B. Hübschle, G. M. Sheldrick, B. Dittrich, ShelX1e: a Qt graphical user interface for SHELXL. *Journal of applied crystallography* 44, 1281-1284 (2011).), resulting in a BASF value of 0.279.

The Rint value given is for all reflections and is based on agreement between observed single and composite intensities and those calculated from refined unique intensities and twin fractions (TWINABS).

The structure exhibits pseudo-translation along the b-axis direction. Modulation is induced by the lead ions, and by differing orientations of the ethyl ammonium linker.

The lead ions are disordered over two alternative positions within the surrounding six iodine atoms. Disorder is related to the pseudo-translational symmetry. The minor moiety ions are related to the major moiety ones by pseudo-translation along b. ADPs of major and minor equivalent atoms were constrained to be identical. Occupancy ratios refined to 0.9751(16) to 0.0249(16). The lead ion disorder does not visibly affect the iodine or ammonium cation positions.

H atoms attached to carbon and nitrogen atoms were positioned geometrically and constrained to ride on their parent atoms. C—H bond distances were constrained to 0.95 Å for alkene C—H moieties, and to 0.99 Å for aliphatic $CH_2$ moieties, respectively. N—H bond distances were constrained to 0.91 Å for pyramidal (sp$^3$ hybridized) ammonium $NH_3^+$ groups. Ammonium $NH_3$+H atoms were allowed to rotate but not to tip to best fit the experimental electron density. $U_{iso}(H)$ values were set to a multiple of $U_{eq}(C)$ with 1.5 for $NH_3$+, and 1.2 for C—H and $CH_2$ units, respectively.

Complete crystallographic data, in CIF format, have been deposited with the Cambridge Crystallographic Data Centre. CCDC contains the supplementary crystallographic data for this paper. These data can be obtained free of charge from The Cambridge Crystallographic Data Centre via www.ccdc.cam.ac.uk/data_request/cif.

Single-crystal XRD data of $(2T)_2PbI_4$ and $(2T)_2PbBr_4$:

|  | $(2T)_2PbI_4$ | $(2T)_2PbBr_4$ |
|---|---|---|
| Crystal data | | |
| Chemical formula | $PbI_4 \cdot 2(C_{10}H_{12}NS_2)$ | $Br_8Pb_2 \cdot 4(C_{10}H_{12}NS_2)$ |
| $M_r$ | 1135.44 | 1894.96 |
| Crystal system, space group | Triclinic, P1 | Triclinic, P$\bar{1}$ |
| Temperature (K) | 150 | 150 |
| a, b, c (Å) | 12.0933(7), b = 12.2631(7), c = 20.8347(12) | 11.3032 (13), 11.6338 (13), 21.602 (2) |
| α, β, γ (°) | 98.415(2), 98.940(2), 90.003(2) | 82.260 (4), 86.069 (5), 89.888 (5) |
| V (Å$^3$) | 3018.6(3) | 2808.0 (5) |
| Z | 4 | 2 |
| Radiation type | Cu Kα | Cu Kα |
| μ (mm$^{-1}$) | 45.67 | 21.23 |
| Crystal size (mm) | 0.12 × 0.10 × 0.02 | 0.21 × 0.15 × 0.01 |
| Data collection | | |
| Diffractometer | Bruker AXS D8 Quest CMOS diffractometer | Bruker AXS D8 Quest CMOS diffractometer |
| $T_{min}$, $T_{max}$ | 0.065, 0.233 | 0.039, 0.174 |
| No. of measured, independent and observed [I > 2σ(I)] reflections | 29414, 16616, 14142 | 81449, 11565, 9366 |
| $R_{int}$ | 0.095 | 0.218 |
| $(\sin \theta/\lambda)_{max}$ (Å$^{-1}$) | 0.639 | 0.631 |
| Refinement | | |
| $R[F^2 > 2\sigma(F^2)]$, $wR(F^2)$, S | 0.080, 0.226, 1.03 | 0.123, 0.332, 1.04 |
| No. of reflections | 16616 | 11565 |
| No. of parameters | 1605 | 571 |
| No. of restraints | 4055 | |
| H-atom treatment | H-atom parameters constrained | H-atom parameters constrained |
| $\Delta\rangle_{max}$, $\Delta\rangle_{min}$ (e Å$^{-3}$) | 4.73, −3.86 | 4.69, −2.60 |
| Absolute structure | Twinning involves inversion, so Flack parameter cannot be determined | |
| Absolute structure parameter | 0.25(2) | |

Computer programs: Apex3 v2017.3-0 (Bruker, 2016), SAINT V8.37A (Bruker, 2016), SHELXS97 (Sheldrick, 2008), SHELXL2018/3 (Sheldrick, 2015, 2018), SHELXLE Rev924 (Hübschle et al., 2011).

Lattice Constants Comparison of $(BA)_2PbBr_4$, $(BA)_2PbI_4$, $(2T)_2PbBr_4$ and $(2T)_2PbI_4$.

| 2D Perovskite | c | Average Pb—Pb distance in x-y plane | Temperature |
|---|---|---|---|
| $(BA)_2PbBr_4$ | 27.6 | 5.85 | 298 K |
| $(BA)_2PbI_4$ | 26.2 | 6.60 | 223 K |
| $(2T)_2PbBr_4$ | 21.6 | 5.85 | 150 K |
| $(2T)_2PbI_4$ | 20.8 | 6.06 | 150 K |

Atomic force microscopy (AFM): AFM images were recorded in tapping mode using a Bruker MultiMode 8 atomic force microscope.

Fluorescent lifetime imaging microscopy (FLIM) measurements: The samples with PMMA coating were measured with a 50×0.55 N.A. air objective in an LSM 510 NLO AxioVert200M Confocal Laser Scanning Microscope equipped with a Mai-Tai HP tunable laser. The excitation wavelength is 405 nm, which is from the second harmonic of 810 nm (<100 fs, 80 MHZ). Lifetime measurements were performed using Becker-Hickl SPC-150 Time-Correlated Single Photon Counting. The lifetime decay is collected and analyzed using Becker-Hickl SPCM software.

TEM Characterizations

Pure $(2T)_2PbI_4$, $(2T)_2PbBr_4$ nanosheets, and $(2T)_2PbI_4$-$(2T)_2PbBr_4$ heterostructure TEM sample preparation: To transfer Pure $(2T)_2PbI_4$, $(2T)_2PbBr_4$ nanosheets, or $(2T)_2PbI_4$-$(2T)_2PbBr_4$ heterostructures to TEM girds, a layer of polymethyl methacrylate (PMMA, 950 PMMA A 4, MICROCHEM) was spin-coated on the growth substrates Si prior to perovskite growth. The spin-coating speed was 3000 rpm and duration time was 1 min. Then Si substrates were placed on 70° C. hot plate for 10 min to condense the PMMA and remove the residue solvent. After that, the perovskites were grown on the PMMA-coated Si.

The transfer process of perovskites from the growth PMMA/Si substrates was performed in the glove box. First, the growth substrates were dipped into CB to dissolve the sacrificial layer PMMA, which facilitates the detachment of samples from the growth substrates. Then vortex mixing or ultrasonication was used to further suspend the samples into CB. The suspension was dropped onto the TEM grids. After the CB evaporated, the TEM grids were rinsed with clean CB a few times to remove the residue PMMA. The TEM grids (Lacey/carbon grids on 200 mesh copper, Ted Pella) are covered by one layer of carbon nanotube film and mono-layer graphene hybrids to mitigate electron beam damage.

TEM imaging and spectrum acquisition: The diffraction patterns were obtained on a 200 kV JEOL JEM-2100plus with a TIVPS CCD camera (TEMCam-XF416). The AC- HRTEM and EDS mapping was taken on an 80 kV aberration-corrected JEOL GrandARM equipped with a fast camera (OneView IS, Gatan). Low accelerating voltage was utilized to enhance the contrast at low magnifications when searching for samples and locating the interface positions. The low dose-rate imaging was achieved by increasing electron beam spot size (decreasing the beam current) and reducing brightness of the electron beam (spreading the beam illumination). To avoid unnecessary electron beam damage, Minimum Dose System (MDS) was used to reduce the damage during searching for the samples and focusing.

TEM simulation and structural model: The kinematical SAED patterns were simulated with MacTempasX. See M. A. O'Keefe, R. Kilaas, Advances in high-resolution image simulation. (1988). The structural models were constructed with VESTA and CrystalKitX. See K. Momma, F. Izumi, VESTA 3 for three-dimensional visualization of crystal, volumetric and morphology data. *Journal of applied crystallography* 44, 1272-1276 (2011).

Molecular Dynamics Simulations

For the molecular dynamics simulation of the heterojunction between Pb—Br and Pb—I organic-inorganic perovskites, the MYP model for hybrid perovskites was used. The MYP model was originally developed for Pb—I perovskites and was extended to Pb—Br perovskites, and it treats the organic-organic interactions by the standard AMBER force field, the inorganic-inorganic interactions between Pb, I, and Br by Buckingham potentials, and the organic-inorganic interactions as the sum of Buckingham, electrostatic, and Lennard-Jones 12-6 terms. As developed and reported, the charges on the metal, halide, and cation are non-integer. For our simulations, we employed integer values for these charges; the MYP non-bonded parameters were appropriately rescaled to reproduce the cohesive energy density of the unscaled simulation.

The surface cation geometries were optimized using ORCA at the ωB97X-D /def2-TVZP Density Functional Theory level. The standard GAFF parameterization was used for the organic cations, with the cation point charges being fit against the electrostatic DFT potential (ωB97X-D/def2-TVZP) of the isolated cation with a +1 charge. LAMMPS was used for the molecular simulations. All simulations used a 1 fs integration timestep and periodic boundary conditions. The particle-particle-particle-mesh (PPPM) algorithm was used for the long-range electrostatics, and LJ interactions were truncated at 15 Å. Following the MYP model, the 1-4 pairwise LJ interactions were scaled by 0.5, and the 1-4 electrostatics interactions were scaled by 0.8333.

The initial perovskite heterojunction geometry was generated by constructing an ideal perovskite monolayer composed of two domains: a 6×0×6 Pb—I domain and a 6×0×6 Pb—Br domain, for a total system sizedof 12×0×6 of $A_2BX_4$ unit cells. Halide vacancies were introduced by randomly removing 2 halide atoms. The simulation was first relaxed under the NVE ensemble for 50 ps with restrained atomic displacements of 0.01 Å per timestep. The system was then simulated for 20 ns with the Nose-Hoover thermostat and barostat, with the barostat applied only the x and z directions in order to allow the surface cations to displace from the perovskite layer, at both 298 K and 800 K. To calculate the free energy required to remove a surface cation and halide, a 6×0×6 unit cell simulation on pristine (i.e. no vacancies) Pb—Br and Pb—I perovskites was run, with a surface cation and halide displaced from their initial positions out to vacuum in 0.5 Å intervals. The system was equilibrated for 0.5 ns and then simulated for 10 ns under the NVT ensemble at 298 K for each displacement. The pymbar package, developed by the Chodera group, was used to calculate the free energies. See M. R. Shirts, J. D. Chodera, Statistically optimal analysis of samples from multiple equilibrium states. *The Journal of chemical physics* 129, 124105 (2008).

Materials Synthesis

All reactions sensitive to air and water were performed in an inert (argon) atmosphere using a Schlenk line setup and tubes. All chemical reagents and solvents were purchased from Sigma-Aldrich and used as received.

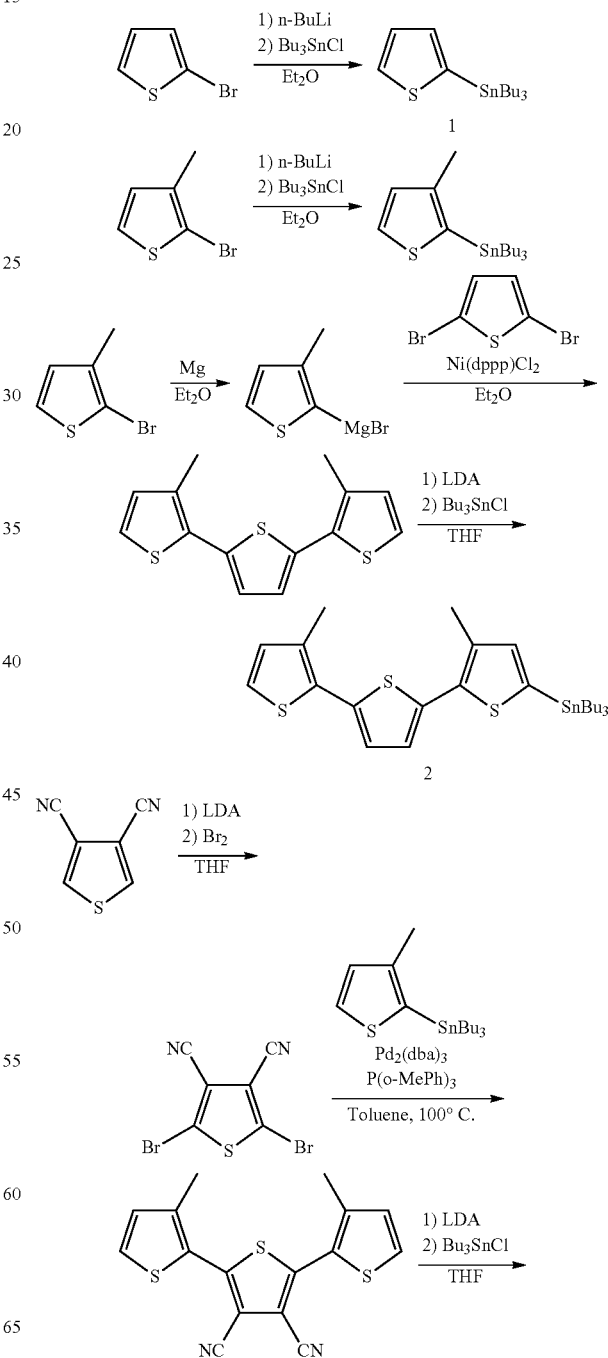

Scheme 1: Synthesis of the organotin reagents

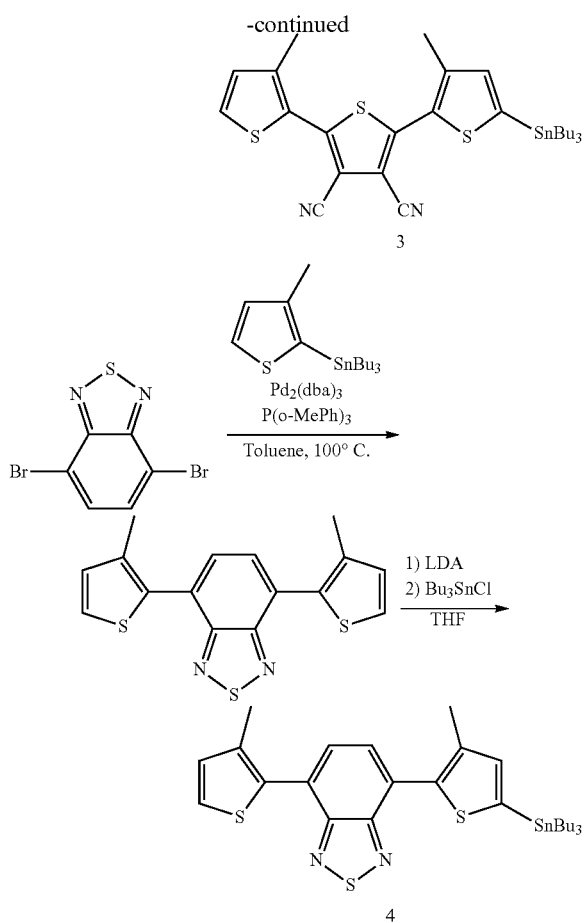

Tributyl(thiophen-2-yl)stannane (1): To a solution of 2-bromothiophene (4.89 g, 30.0 mmol) in Et$_2$O (60 mL) at −78° C. was syringed dropwise n-BuLi (12.2 mL of 2.5 M in hexane, 30.6 mmol) and the reaction was then stirred at −78° C. for half an hour. Tributylstannyl chloride (10.7 g, 33.0 mmol) was added at the same temperature, then the mixture was allowed to warm to room temperature. After washing with water, the organic phase was collected, and the aqueous phase was washed with Et$_2$O. The combined organic phases were washed with brine, dried, and the solvent was removed in vacuo to provide (1) as a clear pale-yellow oil which was used without further purification (11.5 g). $^1$H NMR (400 MHz, Chloroform-d): δ 7.56 (d, J=4.7 Hz, 1H), 7.18 (dd, J=4.6, 3.2 Hz, 1H), 7.12 (d, J=3.1 Hz, 1H), 1.53-1.43 (m, 6H), 1.31-1.21 (m, 6H), 1.05-1.01 (m, 6H) and 0.82 (t, J=7.3 Hz, 9H).

Tributyl(3-methylthiophen-2-yl)stannane: To a solution of 2-bromo-3-methylthiophene (8.85 g, 50.0 mmol) in Et$_2$O (100 mL) at −78° C. was syringed dropwise n-BuLi (21.6 mL of 2.5 M in hexane, 54.0 mmol) and the reaction was then stirred at −78° C. for half an hour. Tributylstannyl chloride (17.9 g, 55.0 mmol) was added at the same temperature, then the mixture was allowed to warm to room temperature. After washing with water, the organic phase was collected, and the aqueous phase was washed with Et$_2$O. The combined organic phases were washed with brine, dried, and the solvent was removed in vacuo to provide the title compound as a clear pale-yellow oil which was used without further purification (19.6 g). $^1$H NMR (400 MHz, Chloroform-d) δ 7.51 (d, J=4.6 Hz, 1H), 7.05 (d, J=4.5 Hz, 1H), 2.32 (s, 3H), 1.58-1.44 (m, 6H), 1.38-1.26 (m, 6H), 1.15-1.06 (m, 6H), 0.89 (t, J=7.3 Hz, 9H).

3,3"-Dimethyl-2,2':5',2"-terthiophene: A Grignard reagent, prepared by adding Et$_2$O solution of 2-bromo-3-methylthiophene (2.27 g, 12.8 mmol) into a mixture of Mg shavings (404 mg, 16.6 mmol) and small grain of iodine in 5 mL dry Et$_2$O, after refluxing for 3 h, and then cooled to room temperature, was slowly added to a solution containing 2,5-dibromothiophene (1.50 g, 6.20 mmol) and Ni(dppp)Cl$_2$ (3 mol %) in 20 mL dry Et$_2$O. The reaction mixture was heated to reflux overnight. Upon completion, the reaction was quenched by the addition of 30 mL 1 M HCl, extracted with DCM and washed with H$_2$O. The organic phase was then dried over MgSO$_4$ and concentrated under reduced pressure. The crude product was purified via column chromatography (silica gel, hexane), yielding the title compound as a slightly yellow oil, which slowly crystallized (1.60 g, 94%). $^1$H NMR (400 MHz, Chloroform-d) δ 7.15 (d, J=5.1 Hz, 2H), 7.08 (s, 2H), 6.89 (d, J=5.1 Hz, 2H), 2.42 (s, 6H).

Tributyl(3,3"-dimethyl-[2,2':5',2"-terthiophen]-5-yl)stannane (2): To a solution of 3,3"-dimethyl-2,2':5',2"-terthiophene (575 mg, 2.08 mmol) in 20 ml of dry THF, a 2.0 M solution of lithium diisopropylamide (LDA) in hexane (1.20 ml, 2.40 mmol) was added dropwise at 0° C. The mixture was stirred for 1 h at room temperature. Afterwards the solution was cooled to 0° C. again and tri(n-butyl)stannyl chloride (745 g, 2.29 mmol) was added. Finally, the mixture was stirred at room temperature for 1 h. Afterwards the reaction mixture was poured into water and extracted with dichloromethane. The organic phase was washed with brine and the organic phase dried over MgSO$_4$. The solvent was removed to produce a yellowish oil which was used without further purification (1.25 g). $^1$H NMR (400 MHz, Chloroform-d) δ 7.14 (t, J=5.2 Hz, 1H), 7.09-7.06 (m, 2H), 6.92 (d, J=2.5 Hz, 1H), 6.89 (dd, J=5.1, 2.9 Hz, 1H), 2.43 (s, 3H), 2.42 (s, 3H), 1.62-1.54 (m, 6H), 1.40-1.31 (m, 6H), 1.17-1.05 (m, 6H), 0.91 (t, J=7.3 Hz, 9H).

2,5-Dibromothiophene-3,4-dicarbonitrile: A solution of 3,4-dicyanothiophene (2.41 g, 18.0 mmol) in dry THF (120 mL) under argon, was cooled to −78° C. and 18.9 mL (37.8 mmol) of LDA (2.0 M in solution of THF/n-heptane/ethylbenzene) was added dropwise. After stirring this mixture for 15 min at −78° C., bromine (2.03 mL, 39.6 mmol) was slowly added. The mixture was then stirred for 2 h at −78° C. The reaction was allowed to warm back to room temperature, then quenched by adding 50 mL of a saturated aqueous solution of NH$_4$Cl. The mixture was extracted with CH$_2$Cl$_2$ and the organic layer was dried over magnesium sulfate, filtered and then evaporated to dryness. The crude solid produced was purified by chromatography on silica gel with DCM as eluent to give 2,5-dibromo-3,4-dicyanothiophene as a white solid (3.16 g, 60%).

3,3"-Dimethyl-[2,2':5',2"-terthiophene]-3',4'-dicarbonitrile: A mixture of 2,5-dibromothiophene-3,4-dicarbonitrile (1.04 g, 3.55 mmol), Pd(PPh$_3$)$_4$ (82.0 mg, 0.071 mmol), and tributyl(3-methylthiophen-2-yl)stannane (3.02 g, 7.81 mmol) was heated to 80° C. in dry DMF (35 mL) under argon for 24 h. After cooling, a saturated solution of NH$_4$Cl (40 mL) was added and the mixture was extracted with DCM. The collected organic layer was then washed with brine. After drying over MgSO$_4$, the organic layer filtrate was concentrated under vacuum. Purification by column chromatography on silica gel eluting by DCM afforded a yellow solid (0.96 g, 83%). $^1$H NMR (400 MHz, Chloroform-d) δ 7.46 (d, J=5.1 Hz, 2H), 7.02 (d, J=5.1 Hz, 2H), 2.43 (s, 6H).

3,3"-Dimethyl-5-(tributylstannyl)-[2,2':5',2"-terthiophene]-3',4'-dicarbonitrile (3): To a solution of 3,3"-dimethyl-[2,2':5',2"-terthiophene]-3',4'-dicarbonitrile (538 mg, 1.65 mmol) in 20 ml of dry THF, a 2.0 M solution of lithium diisopropylamide (LDA) in hexane (0.90 ml, 1.82 mmol) was added dropwise at −78° C. The mixture was stirred for 0.5 h at this temperature. Afterwards tri(n-butyl)stannyl chloride (0.54 mL, 1.98 mmol) was added at the same temperature. Finally, the mixture was stirred at room temperature for 1 h. Afterwards the reaction mixture was poured into water and extracted with dichloromethane. The organic phase was washed with brine and the organic phase dried over MgSO$_4$. The solvent was removed to produce a yellowish oil which was used without further purification (1.05 g). $^1$H NMR (400 MHz, Chloroform-d) δ 7.48-7.42 (m, 1H), 7.04-6.99 (m, 2H), 2.46-2.41 (m, 6H), 1.63-1.53 (m, 6H), 1.40-1.31 (m, 6H), 1.19-1.09 (m, 6H), 0.91 (t, J=7.3 Hz, 9H).

4,7-Bis(3-methylthiophen-2-yl)benzo[c][1,2,5]thiadiazole: Tributyl(3-methylthiophen-2-yl)stannane (1.70 g, 4.40 mmol), 4,7-dibromobenzo[c][1,2,5]thiadiazole (588 mg, 2.00 mmol), Pd$_2$(dba)$_3$ (37 mg, 2 mol %) and P(o-tol)$_3$ (49 mg, 8 mol %) were mixed in a Schlenk tube. After replacing the air with argon, toluene (20 mL) was added via syringe. The mixture was stirred overnight at 100° C. After cooling to room temperature, water was added, and the mixture was extracted with dichloromethane (DCM). The organic layers were combined, washed with brine and dried over magnesium sulfate. The solids were removed by filtration, the solvents were removed under vacuum and the residue was chromatographed on a silica gel column (DCM/hexane=2:3), yielding a yellow solid (645 mg, 98%). $^1$H NMR (400 MHz, Chloroform-d) δ 7.68 (s, 2H), 7.42 (d, J=5.1 Hz, 2H), 7.05 (d, J=5.1 Hz, 2H), 2.36 (s, 6H).

4-(3-Methyl-5-(tributylstannyl)thiophen-2-yl)-7-(3-methylthiophen-2-yl)benzo[c][1,2,5]thiadiazole (4): To a solution of 4,7-bis(3-methylthiophen-2-yl)benzo[c][1,2,5]thiadiazole (1.31 g, 4.00 mmol) in 60 ml of dry THF, a 2.0 M solution of lithium diisopropylamide (LDA) in hexane (2.00 ml, 4.00 mmol) was added dropwise at −78° C. The mixture was stirred for 0.5 h at this temperature. Afterwards tri(n-butyl)stannyl chloride (1.09 mL, 4.00 mmol) was added at the same temperature. Finally, the mixture was allowed to warm back to room temperature and stirred for 1 h. Afterwards the reaction mixture was poured into water and extracted with dichloromethane. The organic phase was washed with brine and the organic phase dried over MgSO$_4$. The solvent was removed and produced a yellowish oil which was used without further purification (2.51 g). $^1$H NMR (400 MHz, Chloroform-d) δ 7.69-7.63 (m, 2H), 7.44-7.39 (m, 1H), 7.12-7.06 (m, 1H), 7.07-7.01 (m, 1H), 2.40-2.32 (m, 6H), 1.66-1.57 (m, 6H), 1.42-1.33 (m, 6H), 1.18-1.11 (m, 6H), 0.92 (t, J=7.3 Hz, 9H).

Scheme 2: Synthesis of the conjugated ligands (Reaction conditions: (i) Boc2O, Et3N, DCM, R.T., (ii) NBS, Chloroform, R.T., (iii) Pd2(dba)3, P(o-MePh)3, Toluene, 100° C., (iv) HI, Methanol, R.T.):

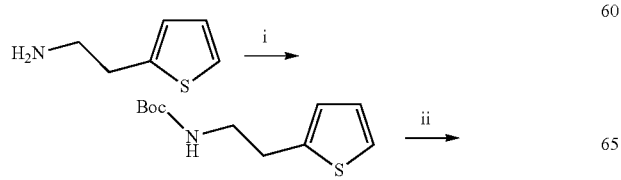

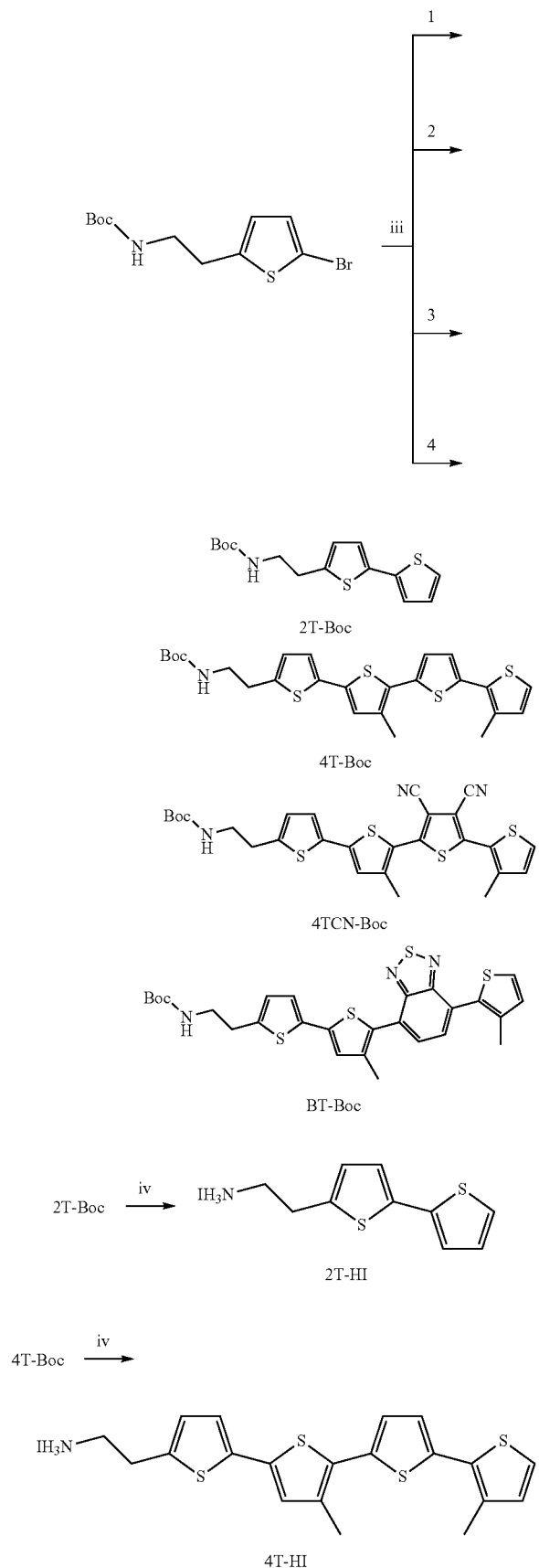

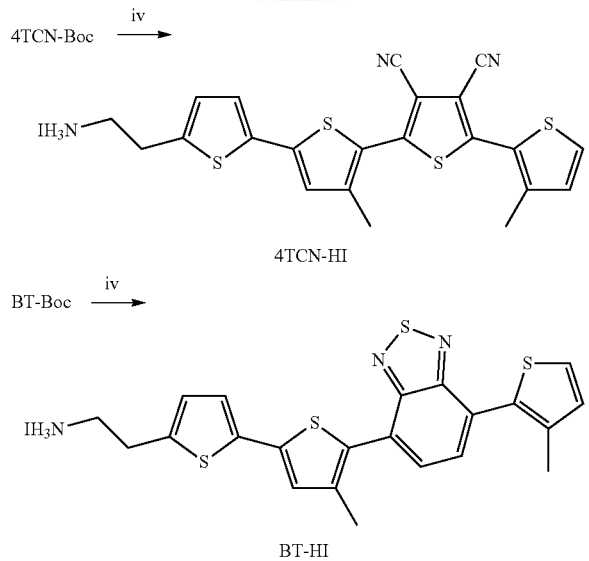

tert-Butyl(2-(thiophen-2-yl)ethyl)carbamate: 2-(Thiophen-2-yl)ethan-1-amine (7.63 g, 60.0 mmol) and 150 mL dry dichloromethane were added to a dried 250-mL Schlenk flask. Then, triethylamine (9.41 g, 93.0 mmol) was added to the solution. Di-tert-butyl dicarbonate (15.71 g, 72.00 mmol) was then added portion-wise which caused bubbles to evolve from the solution. After 4 h, the reaction mixture was placed in a separation funnel and washed with water. The organic layer was collected, dried over magnesium sulfate, and after filtration, the solvent was removed under reduced pressure to provide a yellow oil (98%), which was directly used for the next bromination step without further purification. $^1$H NMR (400 MHz, Chloroform-d) δ 7.17-7.14 (m, 1H), 6.94 (dd, J=5.2, 3.4 Hz, 1H), 6.84-6.82 (m, 1H), 4.65 (s, 1H), 3.40 (d, J=6.5 Hz, 2H), 3.01 (t, J=6.7 Hz, 2H), 1.44 (s, 9H).

tert-Butyl(2-(5-bromothiophen-2-yl)ethyl)carbamate: tert-Butyl(2-(thiophen-2-yl)ethyl)carbamate (3.75 g, 16.5 mmol) was added to a 250-mL flask and dissolved in 50 mL chloroform. The reaction vessel was then wrapped in aluminum foil to exclude light, and NBS (3.08 g, 17.3 mmol) was then added portion wise. After 18 h, the reaction mixture was diluted with chloroform. This mixture was washed with water and then with brine. The organic layer was collected, dried over magnesium sulfate, and concentrated under reduced pressure to provide the crude product as a light-yellow oil. The product was purified by column chromatography with dichloromethane as eluent (90%). $^1$H NMR (400 MHz, Chloroform-d) δ 6.87 (d, J=3.6 Hz, 1H), 6.59 (d, J=3.8 Hz, 1H), 4.64 (s, 1H), 3.35 (d, J=6.5 Hz, 2H), 2.93 (t, J=6.7 Hz, 2H), 1.44 (d, J=2.5 Hz, 9H).

General Method for the Synthesis of Boc Protected Ligands:

tert-Butyl(2-(5-bromothiophen-2-yl)ethyl)carbamate (612 mg, 2 mmol), Pd$_2$(dba)$_3$ (37 mg, 2 mol %), P(o-tol)$_3$ (49 mg, 8 mol %) and the corresponding organotin reagent (2.2 mmol) were mixed in a Schlenk tube. After replacing the air with argon, toluene (20 mL) was added via syringe. The mixture was stirred for 0.5 hours at 100° C. After cooling to room temperature, water was added, and the mixture was extracted with dichloromethane (DCM). The organic layers were combined, washed with brine and dried over magnesium sulfate. The solids were removed by filtration, solvents were removed under vacuum and the residue was chromatographed on a silica gel column as described below. The products were then converted to ammonium salts by adding HI aqueous solution to their methanol solutions.

tert-Butyl(2-([2,2'-bithiophen]-5-yl)ethyl)carbamate (2T-Boc): The crude product was purified by column chromatography with dichloromethane:hexane (1:1) as the eluent. Colorless liquid (72%). $^1$H NMR (400 MHz, Chloroform-d) δ 7.19-7.17 (m, 1H), 7.10 (dd, J=3.7, 1.4 Hz, 1H), 7.00 (d, J=3.5 Hz, 1H), 6.99 (d, J=3.5 Hz, 1H), 6.73 (d, J=3.7 Hz, 1H), 4.68 (s, 1H), 3.41 (d, J=6.5 Hz, 2H), 2.98 (t, J=6.7 Hz, 2H), 1.45 (s, 9H).

tert-Butyl(2-(3''',4'-dimethyl-[2,2':5',2'':5'',2'''-quaterthiophen]-5-yl)ethyl)carbamate (4T-Boc): The product was purified with the same method of 2T-Boc. Yellow solid (68%). $^1$H NMR (400 MHz, Chloroform-d) δ 7.15 (d, J=5.1 Hz, 1H), 7.08 (s, 2H), 6.99 (d, J=3.6 Hz, 1H), 6.91 (s, 1H), 6.89 (d, J=5.1 Hz, 1H), 6.73 (d, J=3.6 Hz, 1H), 4.67 (s, 2H), 3.40 (s, 2H), 3.08-2.91 (m, 2H), 2.41 (d, J=10.5 Hz, 6H), 1.45 (s, 9H).

tert-Butyl(2-(3'',4''-dicyano-3''',4'-dimethyl-[2,2':5',2'':5'', 2'''-quaterthiophen]-5-yl)ethyl)carbamate (4TCN-Boc): The product was purified by column chromatography with dichloromethane: ethyl acetate (10:1) as the eluent. Orange solid (70%). $^1$H NMR (400 MHz, Chloroform-d) δ 7.46 (d, J=5.1 Hz, 1H), 7.08 (d, J=3.6 Hz, 1H), 7.02 (d, J=5.1 Hz, 1H), 7.00 (s, 1H), 6.77 (d, J=3.7 Hz, 1H), 4.68 (s, 1H), 3.42 (d, J=7.5 Hz, 2H), 3.01 (t, J=6.8 Hz, 2H), 2.43 (d, J=6.5 Hz, 6H), 1.45 (s, 9H).

tert-Butyl(2-(4'-methyl-5'-(7-(3-methylthiophen-2-yl)benzo[c][1,2,5]thiadiazol-4-yl)-[2,2'-bithiophen]-5-yl)ethyl)carbamate (BT-Boc): The product was purified by column chromatography with dichloromethane:hexane (2:1) as the eluent. Red solid (82%). $^1$H NMR (400 MHz, Chloroform-d) δ 7.69 (d, J=2.1 Hz, 2H), 7.42 (d, J=5.1 Hz, 1H), 7.09-7.04 (m, 3H), 6.76 (d, J=3.5 Hz, 1H), 4.70 (s, 1H), 3.43 (d, J=6.9 Hz, 2H), 3.01 (t, J=6.6 Hz, 2H), 2.36 (d, J=0.9 Hz, 6H), 1.46 (s, 9H).

General Method for the Synthesis of Ammonium Salt Ligands:

The respective Boc protected ligand (1 mmol) was dissolved in 20 mL methanol (some DCM was added to aid solubility where needed), and aqueous HI solution was then added at 0° C. to cleave the BOC protecting group and in-situ form the ammonium iodides of the ligands. After stirring for 6 h at room temperature, the solvents were removed under vacuum. Diethyl ether was added to the residue, the solid products were collected by filtration, and washed several times with diethyl ether. The products were dried under vacuum for further use.

2T-HI: white powder (90%). $^1$H NMR (400 MHz, DMSO-d$_6$) δ 7.81 (s, 3H), 7.47 (dd, J=5.3, 1.4 Hz, 1H), 7.23 (dd, J=3.5, 1.3 Hz, 1H), 7.15 (d, J=3.5 Hz, 1H), 7.06 (dd, J=5.1, 3.5 Hz, 1H), 6.92 (d, J=3.6 Hz, 1H), 3.05 (d, J=4.0 Hz, 4H).

4T-HI: yellow powder (75%). $^1$H NMR (400 MHz, DMSO-d$_6$) δ 7.80 (s, 3H), 7.47 (d, J=5.1 Hz, 1H), 7.26-7.19 (m, 3H), 7.17 (s, 1H), 7.01 (d, J=5.1 Hz, 1H), 6.96 (d, J=3.5 Hz, 1H), 3.09 (q, J=4.6 Hz, 4H), 2.38 (d, J=2.0 Hz, 6H).

4TCN-HI: orange powder (85%). $^1$H NMR (400 MHz, DMSO-d$_6$) δ 7.84 (d, J=5.1 Hz, 1H), 7.79 (s, 3H), 7.34 (s, 1H), 7.33 (d, J=3.8 Hz, 1H), 7.16 (d, J=5.0 Hz, 1H), 7.02-6.97 (m, 1H), 3.08 (d, J=3.2 Hz, 4H), 2.39 (d, J=1.9 Hz, 6H).

BT-HI: red powder (83%). $^1$H NMR (500 MHz, DMSO-d$_6$) δ 7.88-7.71 (m, 5H), 7.65 (t, J=4.6 Hz, 1H), 7.27-7.19 (m, 2H), 7.08 (d, J=4.3 Hz, 1H), 6.95 (t, J=3.5 Hz, 1H), 3.07 (d, J=5.7 Hz, 4H), 2.30 (dd, J=17.2, 3.6 Hz, 6H).

Those skilled in the art will recognize that numerous modifications can be made to the specific implementations described above. The implementations should not be limited to the particular limitations described. Other implementations may be possible.

We claim:
1. A two-dimensional halide perovskite material, comprising:
a first halide perovskite component of formula $L_2A_{n-1}M_nX_{3n+1}$ and a second halide perovskite component of formula $L'_2A'_{n'-1}M'_nX'_{3n'+1}$, wherein:
L and L' represent
an asymmetric mono-ammonium cationic moiety:

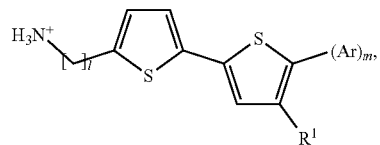

wherein $R^1$ is —H, —F, —Cl, —Br, —I, -Me, -Et, -OMe, -OEt, -SMe, -SEt, —CN, —NO$_2$, -COMe, —CHO, -COOMe, or —NH-COMe;
(Ar)$_m$ represents a conjugated and optionally substituted aryl or hetero aryl system, or a combination thereof, wherein each aryl or hetero aryl ring in the conjugated and optionally substituted aryl or hetero aryl system may be the same or different;
l is 1-4; and
m is 0-5:
A and A' each independently represents a cation $C^s+$, $Rb^+$, $CH_3NH_3^+$, $CH_3CH_2NH_3^+$, or

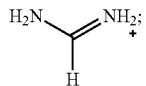

M and M' each independently represents a divalent metal cation $Pb^{2+}$, $Sn^{2+}$, $Ge^{2+}$, $Cu^{2+}$, $Zn^{2+}$, $Cd^{2+}$, $Hg^{2+}$, $Ni^{2+}$, $Co^{2+}$, $Fe^{2+}$, $Mn^{2+}$, $Cr^{2+}$, $V^{2+}$, $Pd^{2+}$, or $Pt^{2+}$;
X and X' each independently represents F$^-$, Cl$^-$, Br$^-$ or I$^-$;
n and n' each independently is 1-6; and
wherein the first halide perovskite component and the second halide perovskite component are not the same perovskite, and the first halide perovskite is first formed as a lateral core and the second halide perovskite is formed surrounding the lateral core of the first halide perovskite.

2. The two-dimensional halide perovskite material of claim 1, wherein $R^1$ is —F, —Cl, —Br, —I, -Me, -Et, -OMe, -OEt, -SMe, -SEt, —CN, —NO$_2$, -COMe, —CHO, -COOMe, or —NH-COMe.

3. The two-dimensional halide perovskite material of claim 1, wherein $R^1$ is -Me.

4. The two-dimensional halide perovskite material of claim 1, wherein (Ar)$_m$ represents a conjugated and optionally substituted aryl or hetero aryl system, or a combination thereof, wherein each aryl or hetero aryl ring in the conjugated and optionally substituted aryl or hetero aryl system may be same or different, wherein Ar is selected from the group consisting of:

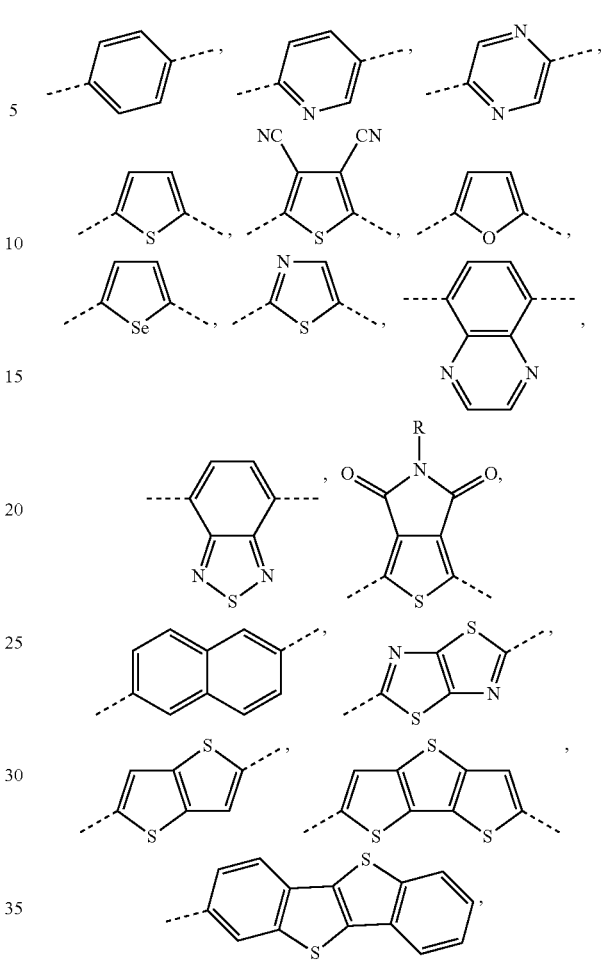

and any combination thereof.

5. The two-dimensional halide perovskite material of claim 4, wherein Ar is selected from the group consisting of:

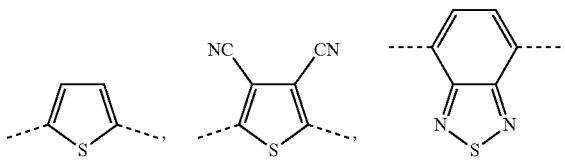

and any combination thereof.

6. The two-dimensional halide perovskite material of claim 1, wherein L is selected from the group consisting of:

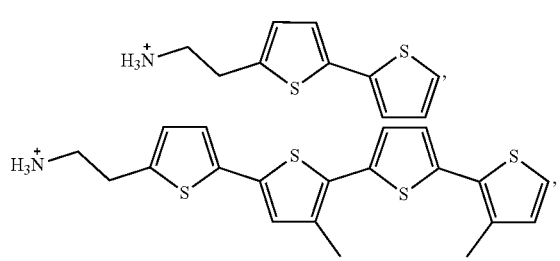

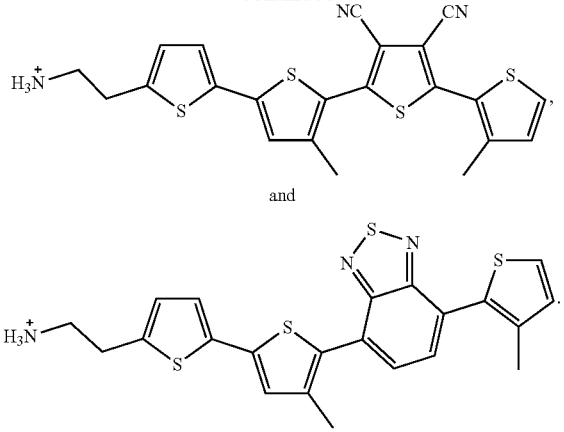

and

7. The two-dimensional halide perovskite material of claim 1, wherein the two-dimensional halide perovskite material is formed as a sheet with a thickness of 1-1000 nm.

8. The two-dimensional halide perovskite material of claim 1, wherein lateral joint between the first and the second halide perovskite are substantially free of anion inter-diffusion.

9. The two-dimensional halide perovskite material of claim 1, wherein the two-dimensional halide perovskite material is used for light-emitting diodes, lasers, infrared photodetectors, transistors, thermoelectric devices, or solar cells.

10. A solution-phase synthetic method of preparing the two-dimensional halide perovskite material comprising a first halide perovskite component of formula $L_2A_{n-1}M_nX_{3n+1}$ and a second halide perovskite component of formula $L'_2A'_{n'-1}M'_{n'}X'_{3n'+1}$, wherein:

L and L' represent an asymmetric mono-ammonium cationic moiety:

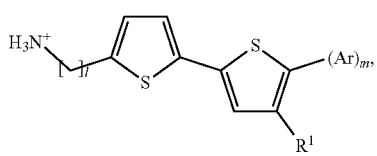

wherein $R^1$ is —H, —F, —Cl, —Br, -I, -Me, -Et, -OMe, -OEt, -SMe, -SEt, —CN, —NO$_2$, -COMe, —CHO, -COOMe, or —NH-COMe;

$(Ar)_m$ represents a conjugated and optionally substituted aryl or hetero aryl system, or a combination thereof, wherein each aryl or hetero aryl ring in the conjugated and optionally substituted aryl or hetero aryl system may be the same or different l is 1-4; and m is 0-5;

A and A' each independently represents a cation Cs$^+$, Rb$^+$, CH$_3$NH$_3^+$, CH$_3$CH$_2$NH$_3^+$, or $$\overset{H_2N}{\underset{H}{\diagdown}}\hspace{-2pt}\overset{+}{C}\hspace{-2pt}\overset{NH_2}{\diagup};$$

M and M' each independently represents a divalent metal cation Pb$^{2+}$, Sn$^{2+}$, Ge$^{2+}$, Cu$^{2+}$, Zn$^{2+}$, Cd$^{2+}$, Hg$^{2+}$, Ni$^{2+}$, Co$^{2+}$, Fe$^{2+}$, Mn$^{2+}$, Cr$^{2+}$, V$^{2+}$, Pd$^{2+}$, or Pt$^{2+}$;

X and X' each independently represents F$^-$, Cl$^-$, Br$^-$ or I$^-$;

n and n' each independently is 1-6; and wherein the first halide perovskite component and the second halide perovskite component are not the same perovskite, and the first halide perovskite is first formed as a lateral core and the second halide perovskite is formed surrounding the lateral core of the first halide perovskite, wherein the method comprises:

providing a solution of a first precursor and a first solvent system for preparing the first halide perovskite component of formula $L_2A_{n-1}M_nZ_{3n+1}$;

adding the solution of the first precursor to a first container with a growth substrate for growing the first halide perovskite component;

placing the first container inside a second container with a second solvent system, wherein the second solvent system is not in direct contact with the solution of the first precursor and the second solvent system is served as an anti-solvent system for slowing down the evaporation of the first solvent system;

capping the second container and elevating the temperature of the second container to allow the growth of a nano-sheet of the first halide perovskite component;

cleaning the substrate with the nano-sheet of the first halide perovskite component and making it ready for growing of the second halide perovskite component of formula $L'_2A'_{n'-1}M'_{n'}X'_{3n'+1}$; and repeating the same steps to make the second halide perovskite component of formula $L'_2A'_{n'-1}M'_{n'}X'_{3n'+1}$ surrounding the lateral core of the first halide perovskite.

11. The method of claim 10, wherein the growth substrate comprises SiO$_2$, Si, or a combination thereof.

12. The method of claim 10, wherein a solution concentration for making the second halide perovskite component of formula $L'_2A'_{n'-1}M'_{n'}X'_{3n'+1}$ is lower than a solution concentration for making the first halide perovskite component of formula $L_2A_{n-1}M_nX_{3n+1}$.

13. The method of claim 10, wherein the temperature for making the second halide perovskite component of formula $L'_2A'_{n'-1}M'_{n'}X'_{3n'+1}$ is lower than the temperature for making the first halide perovskite component of formula $L_2A_{n+1}M_nX_{3n-1}$.

14. The method of claim 10, wherein the first solvent system comprises chlorobenzene, dimethylformide, acetonitrile, and dichlorobenzene, and the second solvent system comprises chlorobenzene.

* * * * *